US009064689B2

(12) United States Patent
Tokumitsu et al.

(10) Patent No.: US 9,064,689 B2
(45) Date of Patent: Jun. 23, 2015

(54) SEMICONDUCTOR DEVICE AND MANUFACTURING METHOD THEREOF

(75) Inventors: Shigeo Tokumitsu, Kanagawa (JP); Akio Uenishi, Kanagawa (JP)

(73) Assignee: RENESAS ELECTRONICS CORPORATION, Kanagawa (JP)

(*) Notice: Subject to any disclaimer, the term of this patent is extended or adjusted under 35 U.S.C. 154(b) by 0 days.

(21) Appl. No.: 13/451,145

(22) Filed: Apr. 19, 2012

(65) Prior Publication Data
US 2012/0273900 A1    Nov. 1, 2012

(30) Foreign Application Priority Data

Apr. 27, 2011    (JP) .................................. 2011-099386

(51) Int. Cl.
H01L 29/10 (2006.01)
H01L 21/38 (2006.01)
H01L 29/78 (2006.01)
H01L 27/02 (2006.01)
H01L 21/8234 (2006.01)
H01L 21/8238 (2006.01)
H01L 29/66 (2006.01)
(Continued)

(52) U.S. Cl.
CPC .... *H01L 27/0207* (2013.01); *H01L 21/823418* (2013.01); *H01L 21/823456* (2013.01); *H01L 21/823475* (2013.01); *H01L 21/823493* (2013.01); *H01L 21/823814* (2013.01); *H01L 21/82385* (2013.01); *H01L 21/823871* (2013.01); *H01L 21/823892* (2013.01); *H01L 29/41758* (2013.01); *H01L 29/42364* (2013.01);
(Continued)

(58) Field of Classification Search
CPC ................ H01L 29/78; H01L 29/7816; H01L 29/66681; H01L 29/0692; H01L 29/0847; H01L 29/42376; H01L 29/4238; H01L 27/0251; H01L 27/092
USPC .......................... 257/339, 401, 402, 409, 336
See application file for complete search history.

(56) References Cited

U.S. PATENT DOCUMENTS 6,252,279 B1 * 6/2001 Kim .............................. 257/335
6,399,468 B2   6/2002 Nishibe et al.
(Continued)

FOREIGN PATENT DOCUMENTS

JP    2001-298184 A    10/2001
JP    2002-304154 A    10/2002
(Continued)

OTHER PUBLICATIONS

Notification of Reasons for Refusal issued in Japanese Application No. 2011-099386 dated Aug. 5, 2014, w/English translation.

*Primary Examiner* — Julia Slutsker
*Assistant Examiner* — Natalia Gondarenko
(74) *Attorney, Agent, or Firm* — McDermott Will & Emery LLP

(57) ABSTRACT

The high voltage transistor includes a first impurity layer, a second impurity layer formed inside the first impurity layer, so as to put the second impurity layer between them, a pair of third impurity layers and fourth impurity layers formed inside the first impurity layer, a fifth impurity layer formed from the uppermost surface of the first impurity layer to the inside of the first impurity layer so as to protrude along the main surface in the direction where the second impurity layer is disposed, and a conductive layer formed above the uppermost surface of the second impurity layer. The concentration of the impurity in the fourth impurity layer is higher than the concentration of the impurity in the third and the fifth impurity layers, and the concentration of the impurity in the fifth impurity layer is higher than the concentration of the impurity in the third impurity layer.

17 Claims, 33 Drawing Sheets

(51) Int. Cl.
  *H01L 29/417* (2006.01)
  *H01L 29/423* (2006.01)
  *H01L 29/06* (2006.01)
  *H01L 29/08* (2006.01)

(52) U.S. Cl.
  CPC ....... *H01L 29/4238* (2013.01); *H01L 29/66689* (2013.01); *H01L 29/7816* (2013.01); *H01L 29/7833* (2013.01); *H01L 29/7835* (2013.01); *H01L 29/7836* (2013.01); *H01L 29/0692* (2013.01); *H01L 29/0847* (2013.01); *H01L 29/1033* (2013.01); *H01L 29/1083* (2013.01); *H01L 29/1087* (2013.01); *H01L 29/1095* (2013.01); *H01L 29/66568* (2013.01); *H01L 29/66575* (2013.01)

(56) References Cited

U.S. PATENT DOCUMENTS

| | | | |
|---|---|---|---|
| 6,621,116 B2* | 9/2003 | Church | 257/314 |
| 6,628,087 B2 | 9/2003 | Roh et al. | |
| 7,208,386 B2* | 4/2007 | Pendharkar | 438/335 |
| 7,259,054 B2 | 8/2007 | Yasuoka et al. | |
| 7,339,236 B2* | 3/2008 | Nitta et al. | 257/347 |
| 2002/0017683 A1* | 2/2002 | Jeon | 257/339 |
| 2004/0256646 A1* | 12/2004 | Lee et al. | 257/288 |
| 2005/0067653 A1* | 3/2005 | Litwin et al. | 257/335 |
| 2005/0073007 A1* | 4/2005 | Chen et al. | 257/355 |
| 2005/0282321 A1 | 12/2005 | Hsu | |
| 2008/0061368 A1* | 3/2008 | Williams et al. | 257/336 |
| 2009/0194785 A1* | 8/2009 | Lu et al. | 257/139 |
| 2010/0052050 A1* | 3/2010 | Lotfi et al. | 257/334 |

FOREIGN PATENT DOCUMENTS

| | | |
|---|---|---|
| JP | 2003-15600 A | 1/2003 |
| JP | 2006-40907 A | 2/2006 |
| JP | 2009-529806 A | 8/2009 |
| JP | 2009-295684 A | 12/2009 |
| JP | 2011-035412 A | 2/2011 |
| WO | 2007/106764 A2 | 9/2007 |

* cited by examiner

HV-NMOS AND HV-PMOS FORMING REGIONS

BIDIRECTIONAL PMOS FORMING REGION

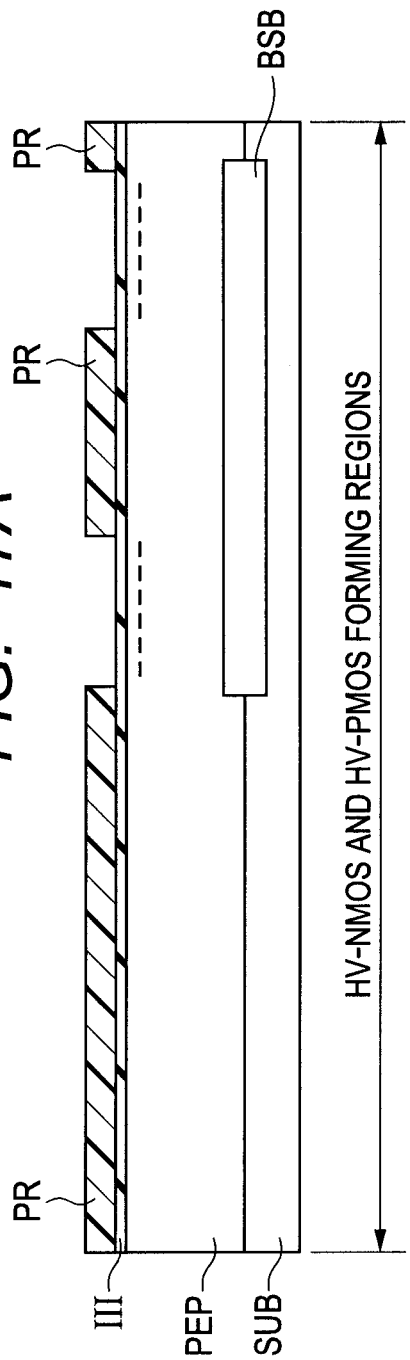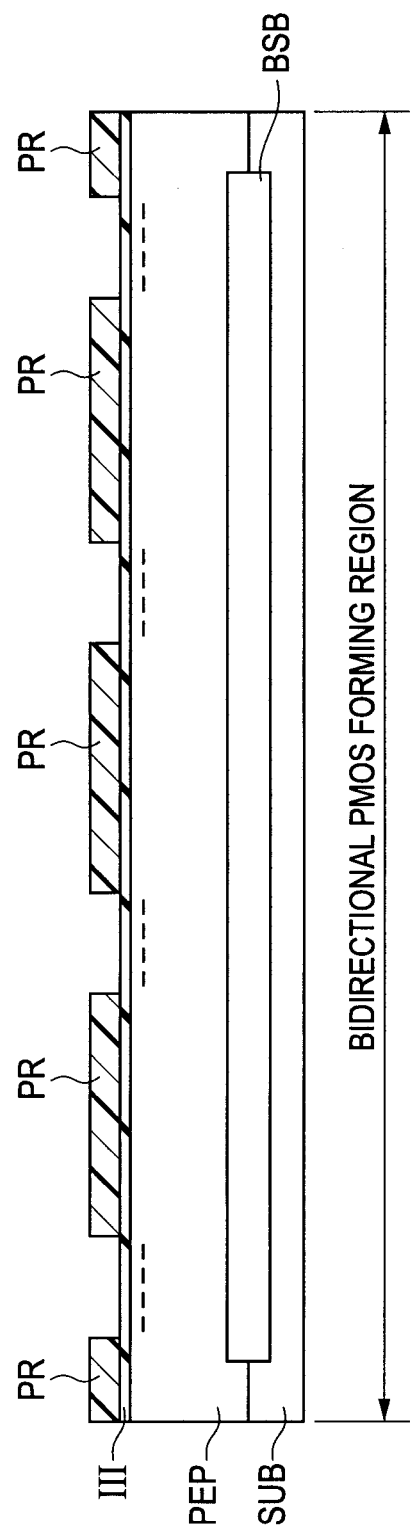

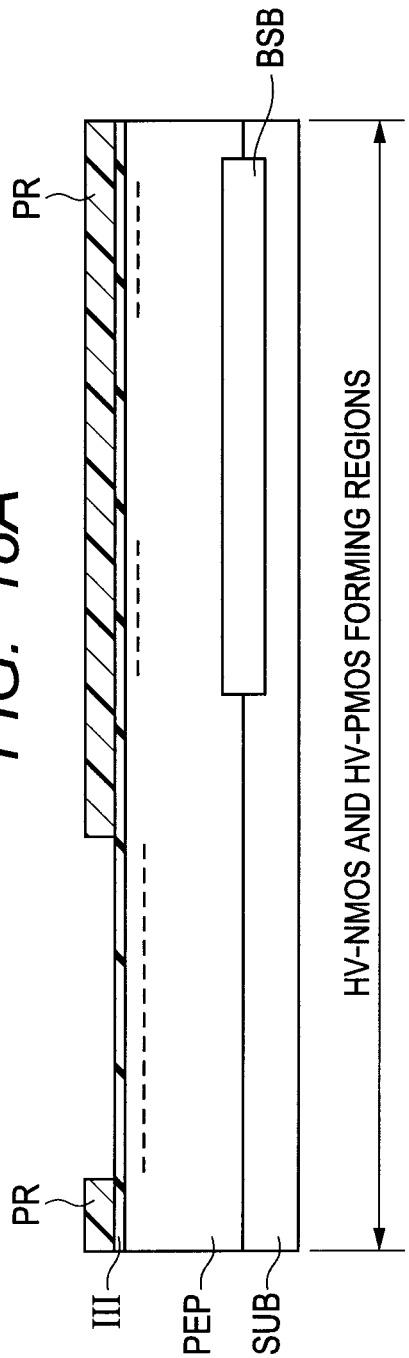
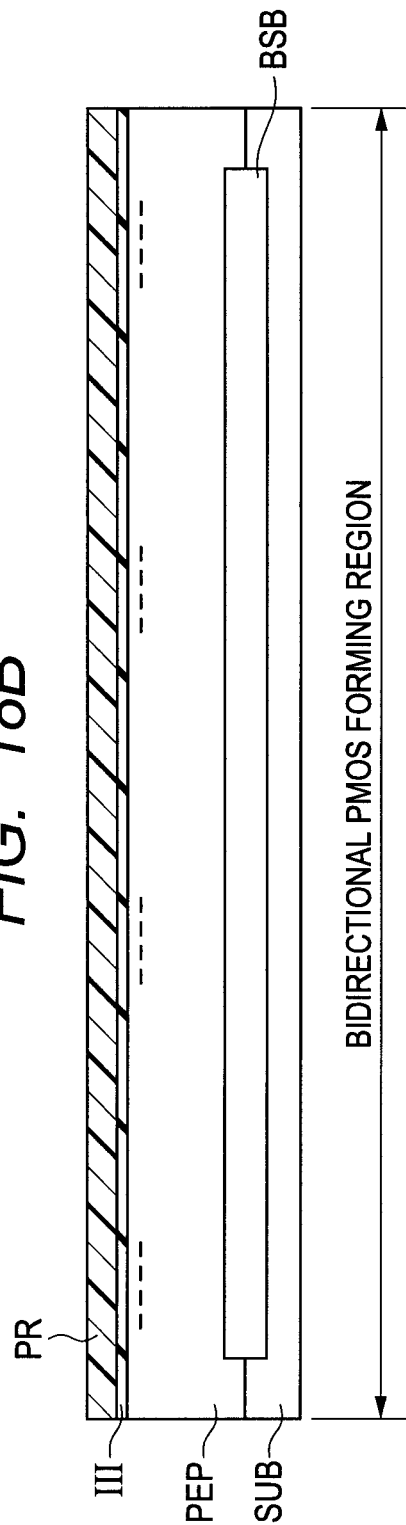

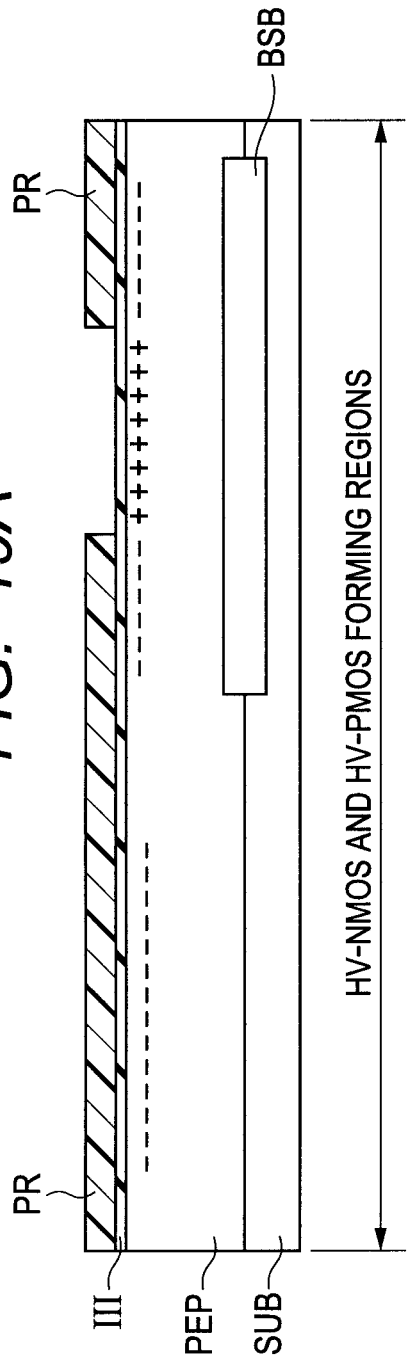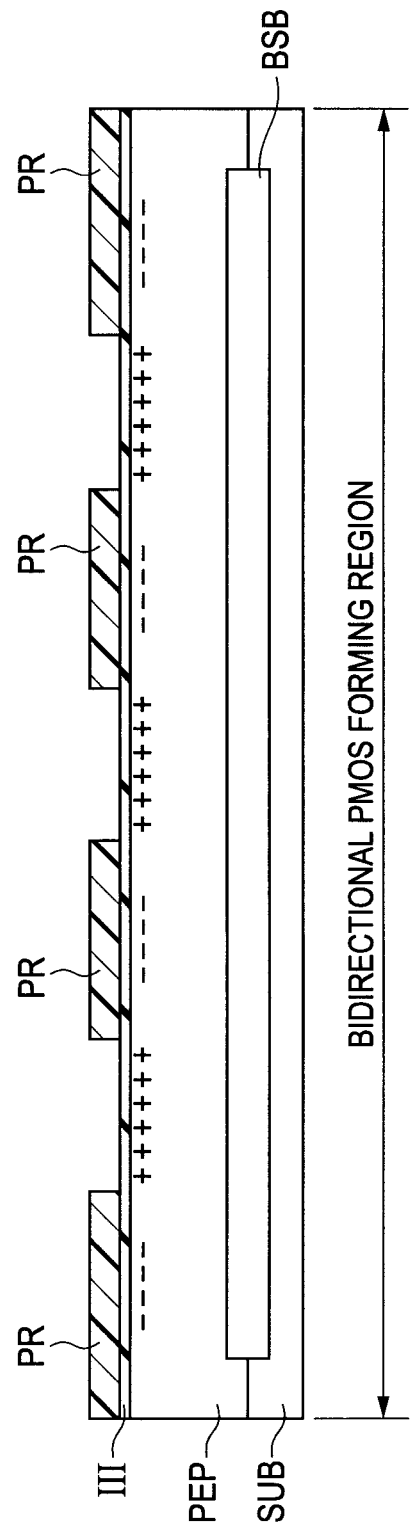

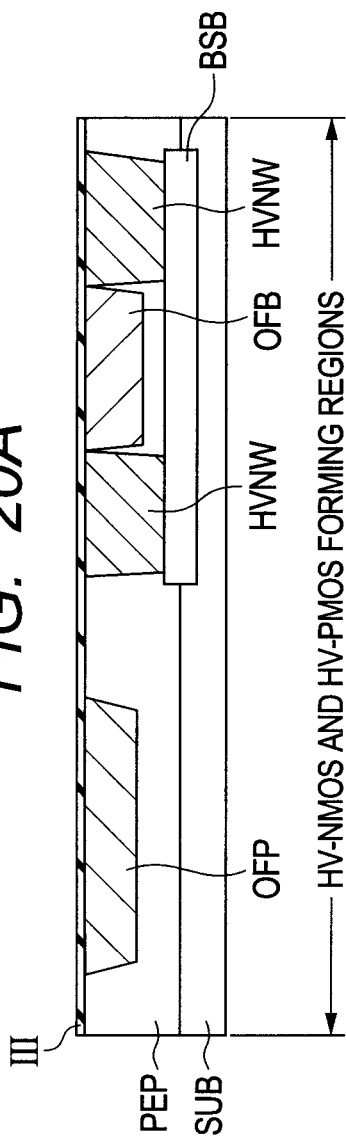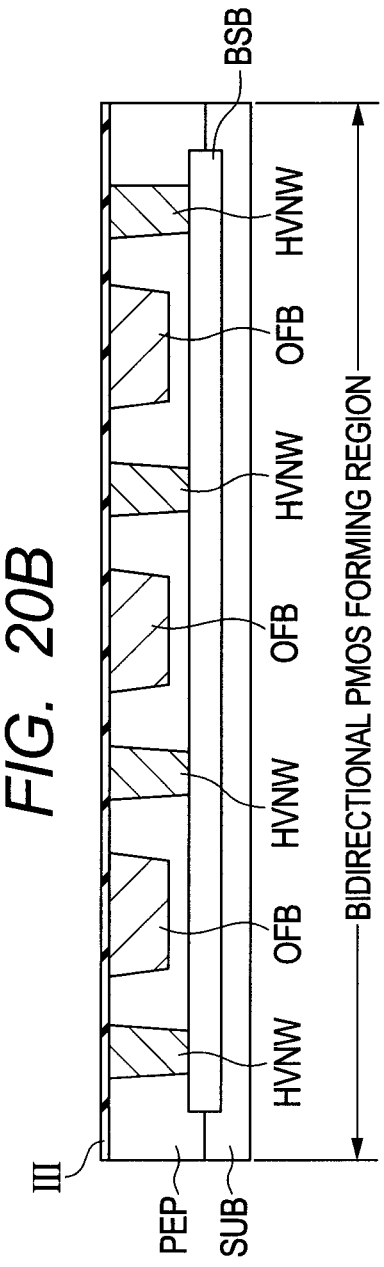

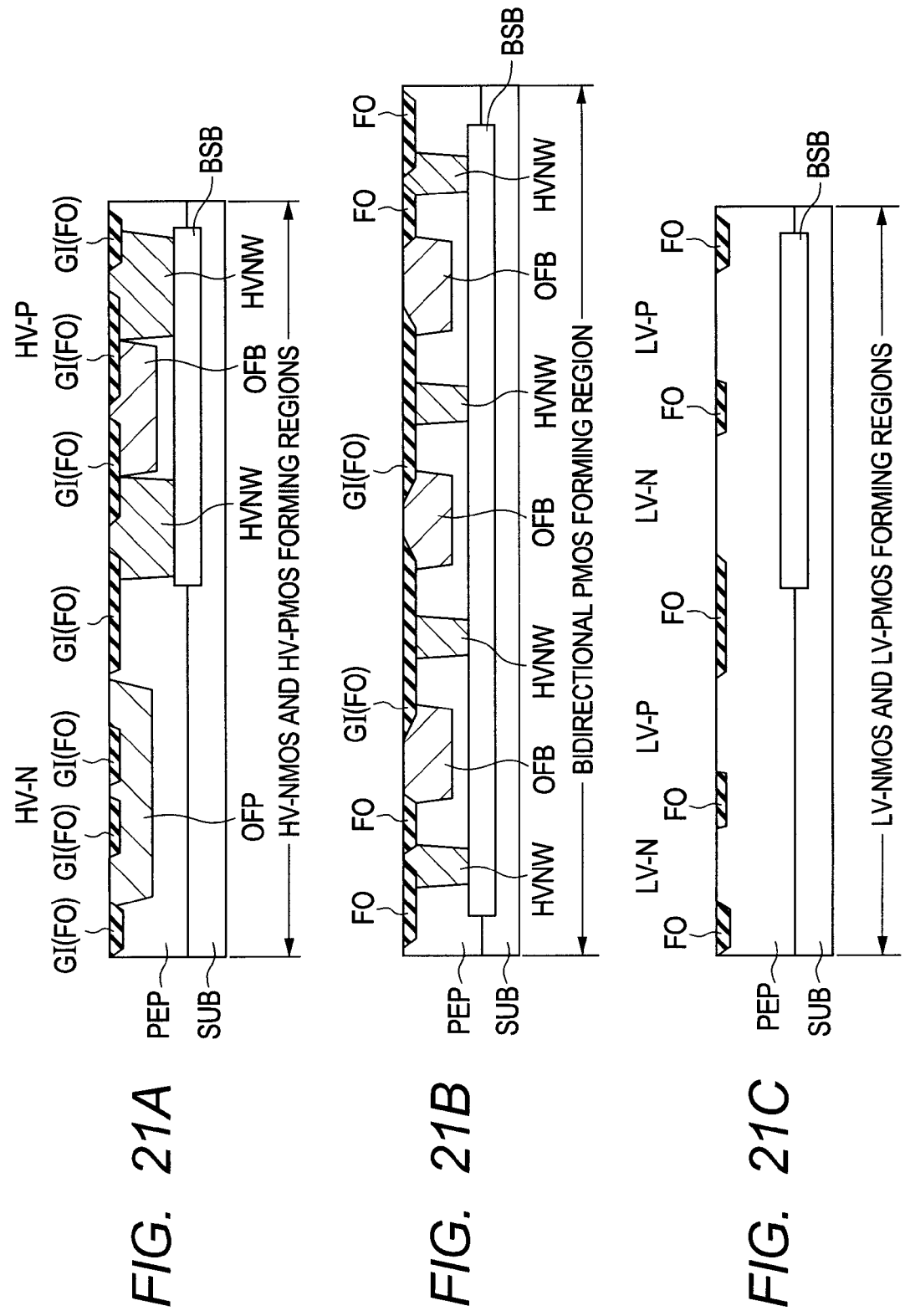

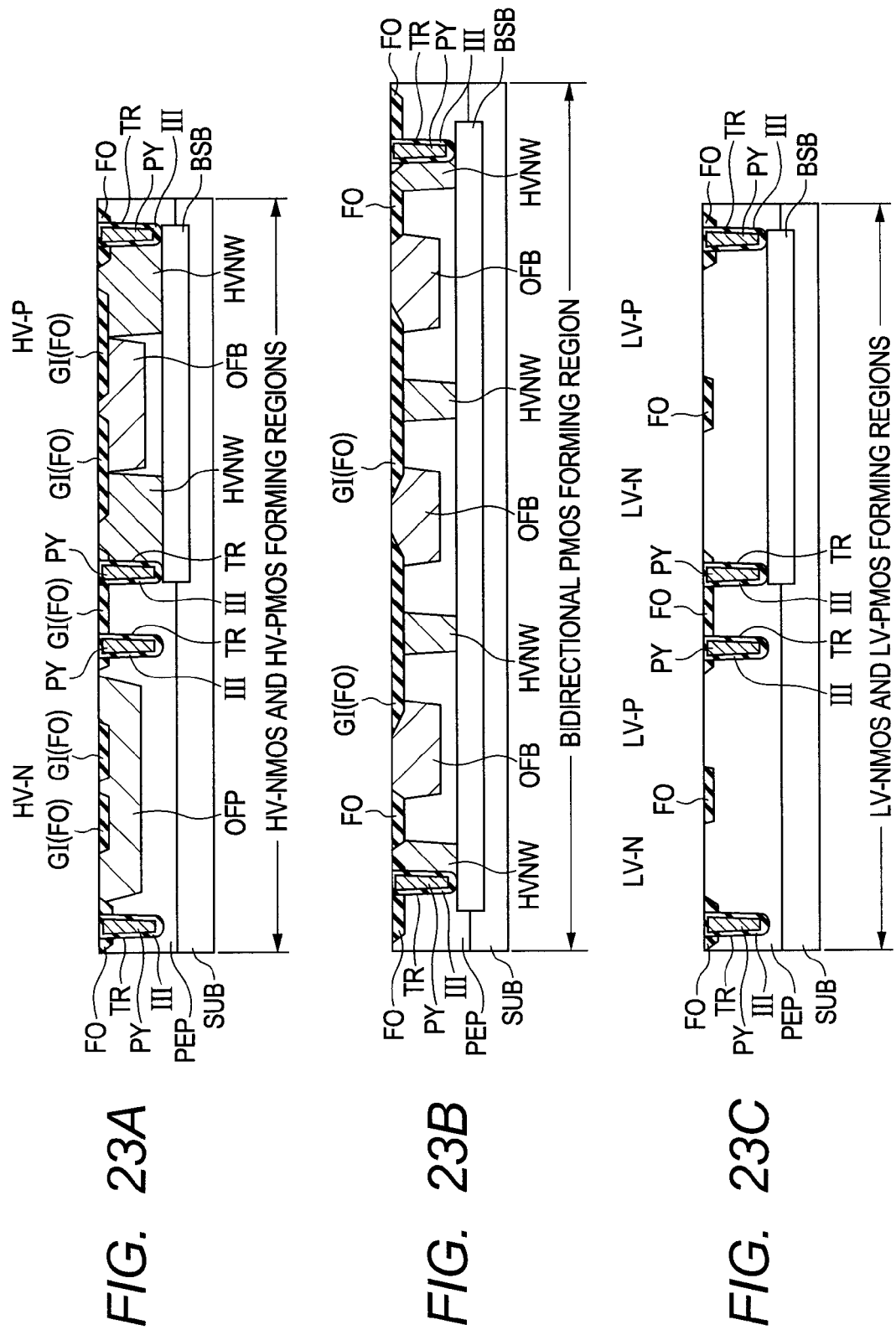

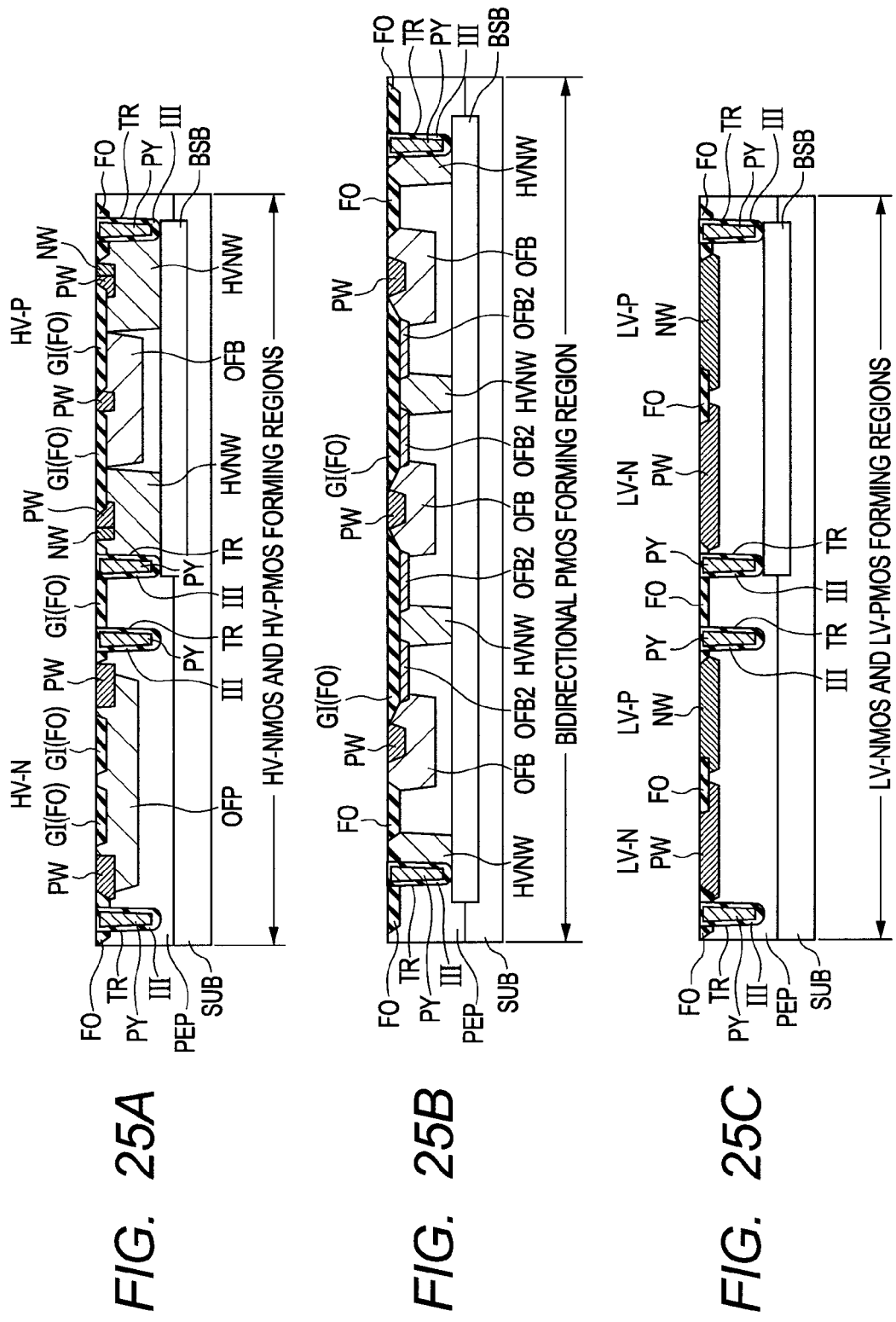

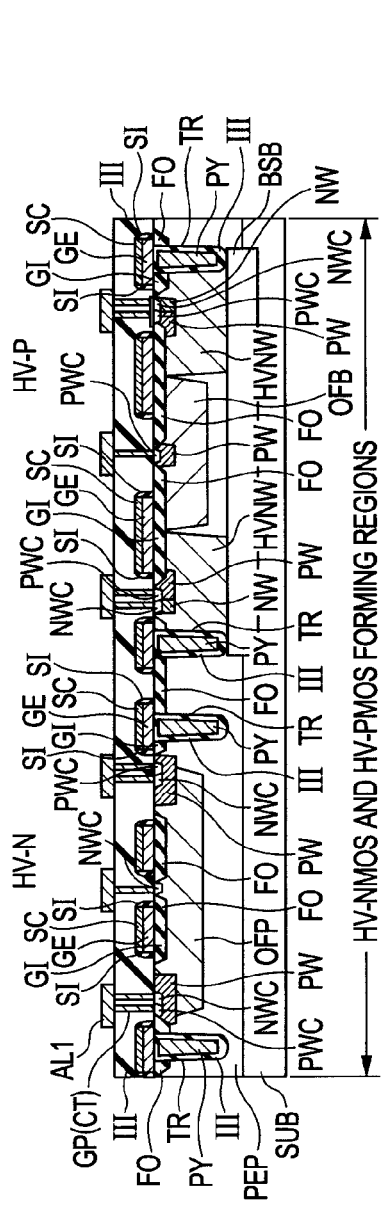
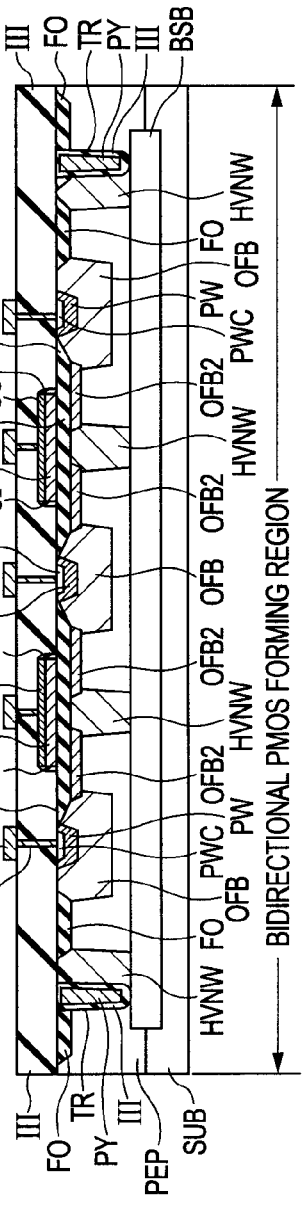
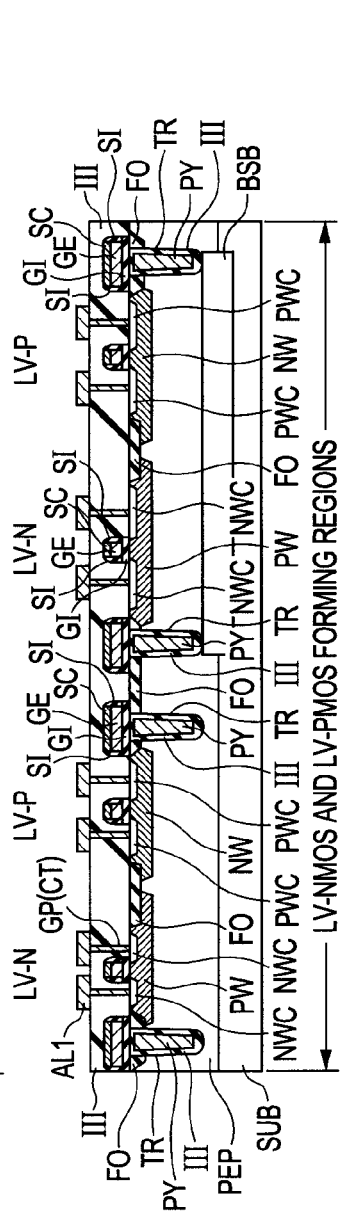
FIG. 30A
FIG. 30B
FIG. 30C

US 9,064,689 B2

SEMICONDUCTOR DEVICE AND MANUFACTURING METHOD THEREOF

CROSS-REFERENCE TO RELATED SPECIFICATIONS

The disclosure of Japanese Patent Application No. 2011-099386 filed on Apr. 27, 2011 including the specification, drawings, and abstract is incorporated herein by reference in its entirety.

BACKGROUND

The present invention concerns a semiconductor device and a manufacturing method thereof and, more specifically, it relates to a semiconductor device having a so-called high withstanding voltage structure and a manufacturing method thereof.

Along with reduction in weight and size of various pieces of electronic equipment in recent years, semiconductor devices mounted on the electronic equipment have been refined more and more. For example, in semiconductor chips for applying current to pixels of plasma displays, it has been attempted to decrease the area occupied by the semiconductor chips by hybridizing a low voltage driven transistor driven at a low voltage and a high voltage transistor driven at a high voltage.

For example, the semiconductor device disclosed, for example, in Japanese Unexamined Patent Publication No. 2006-40907, MOS (Metal Oxide Semiconductor) transistors used for so-called switching in the semiconductor device can be used under the condition of higher withstanding voltage.

Further, for driving the pixel of the plasma display, a so-called power recovery circuit as disclosed, for example, in Japanese Unexamined Patent Publication No. 2003-15600 is sometimes used. The power recovery circuit uses, as a switching device, a high voltage transistor capable of transferring and storing charges stored in a load capacitor used in the pixels to other external capacitor (charge share capacitor) and re-utilizing the charges. For the power recovery circuit, a bidirectional switching device capable of flowing current from one to the other direction and from the other to the one direction of a pair of main electrodes is used preferably as disclosed, for example, in Japanese Unexamined Patent Publication No. 2009-295684.

SUMMARY

In the semiconductor device disclosed in Japanese Unexamined Patent Publication No. 2006-40907, the withstanding voltage of a MOS transistor can be controlled optionally by changing the shortest distance between one end of a gate electrode and one end in a high density diffusion region as a source region or a drain region of the MOS transistor. However, when the withstanding voltage of the MOS transistor is increased by extremely increasing the distance, a so-called ON-resistance between the source electrode and the drain electrode increases when the MOS transistor is in an on-state thereby possibly lowering the current performance. That is, increase in the withstanding voltage and decrease in the ON-resistance of the MOS transistor are in a trade off relation. In the semiconductor device as disclosed in Japanese Unexamined Patent Publication No. 2006-40907, the trade off relation to the increase in the ON-resistance that may occur when the withstanding voltage of the MOS transistor is increased is not taken into consideration.

The power recovery circuit disclosed in Japanese Unexamined Patent Publication No. 2003-15600 contains no description at all for the withstanding voltage of the semiconductor device as a component of the circuit. Even when the bidirectional switching device disclosed in Japanese Unexamined Patent Publication No. 2009-295684 is used, this is still insufficient as means for solving the trade-off relation.

The present invention has been achieved in view of the foregoing problems and intends to provide a semiconductor device which can decrease the ON-resistance and can be driven under high withstanding voltage, as well as a manufacturing method thereof.

A semiconductor device as an aspect of the invention has the following configuration.

The semiconductor device has high voltage transistors. The high voltage transistor comprises a semiconductor substrate having a main surface, a first impurity layer formed over the main surface of the semiconductor substrate, a second impurity layer formed inside the first impurity layer, a pair of third impurity layers formed in the inside of the pair of first impurity layers so as to put the second impurity layer therebetween, a fourth impurity layer formed in the inside of each of the pair of the third impurity layers, a fifth impurity layer formed from the uppermost surface of the first impurity layer to the inside of the first impurity layer so as to protrude along the main surface from at least one of the third impurity layers in the direction where the second impurity layer is disposed, and a conductive layer formed above the uppermost surface so as to at least partially overlap the second impurity layer in a plan view.

The concentration of the impurity in the fourth impurity layer is higher than the concentration of the impurity in the third and fifth impurity layers, and the concentration of the impurity in the fifth impurity layer is higher than the concentration of the impurity in the third impurity layer.

A method of manufacturing a semiconductor device as another aspect of the invention includes the following steps.

The manufacturing method is a method of manufacturing a semiconductor having high voltage withstanding transistors. In the manufacturing method, a semiconductor substrate having a main surface is at first provided. A first impurity layer is formed over the main surface of the semiconductor substrate. The second impurity layer is formed inside the first impurity layer. A pair of third impurity layers are formed inside the first impurity layer so as to put the second impurity layer therebetween. A fourth impurity layer is formed to the inside of each of the pair of third impurity layers. A fifth impurity layer is formed from the uppermost surface of the first impurity layer to the inside of the first impurity layer so as to protrude along the main surface at least from one of the third impurity layers in the direction where the second impurity layer is disposed. A conductive layer is formed above the uppermost surface so as to at least partially overlap the second impurity layer in a plan view. The concentration of the impurity in the fourth impurity layer is higher than the concentration of the impurity in the third and the fifth impurity layers, and the concentration of the impurity in the fifth impurity layer is higher than the concentration of the impurity in the third impurity layer.

According to the aspect, the fifth impurity layer formed between the second impurity layer and the third impurity layer has a concentration of the impurity higher than the concentration of the impurity in the third impurity layer. Therefore, the ON-resistance of the semiconductor device is lowered further by substantially shortening the channel region put between the source region and the drain region. On the other hand, the fourth impurity region having the concentration of the impurity lower than the concentration of the impurity in the fifth impurity layer further increases the withstanding voltage near the uppermost surface of the first impurity layer in a not used state. Accordingly, a semiconductor device having both the functions of low ON-resistance and high withstanding voltage can be provided.

According to the manufacturing method of the aspect, a semiconductor device in which the fifth impurity layer formed between the second impurity layer and the third impurity layer has the concentration of the impurity higher than the concentration of the impurity in the third impurity region is formed. Therefore, the ON-resistance of the semiconductor device is further lowered by substantially shortening the channel region further put between the source region and the drain region. On the other hand, the fourth impurity layer having the concentration of the impurity lower than the concentration of the impurity in the fifth impurity layer further increases the withstanding voltage near the uppermost surface of the first impurity layer in the not used state. Accordingly, a semiconductor device having both functions of the low ON-resistance and high withstanding voltage is formed.

BRIEF DESCRIPTION OF THE DRAWINGS

FIG. 17A is a schematic cross sectional view showing a fourth step of the manufacturing method in the HV-NMOS and HV-PMOS forming region of the semiconductor device in the first embodiment of the invention;

FIG. 17B is a schematic cross sectional view showing the fourth step of the manufacturing method in the HV-PMOS forming region for the bidirectional switch of the semiconductor device in the first embodiment of the invention;

FIG. 18A is a schematic cross sectional view showing a fifth step of the manufacturing method in the HV-NMOS and HV-PMOS forming regions of the semiconductor device in the first embodiment of the invention;

FIG. 18B is a schematic cross sectional view showing the fifth step of the manufacturing method in the HV-PMOS forming region for the bidirectional switch of the semiconductor device in the first embodiment of the invention;

FIG. 19A is a schematic cross sectional view showing a sixth step of the manufacturing method in the HV-NMOS and HV-PMOS forming region of the semiconductor device in the first embodiment of the invention;

FIG. 19B is a schematic cross sectional view showing the sixth step of the manufacturing method in the HV-PMOS forming region for the bidirectional switch of the semiconductor device in the first embodiment of the invention;

FIG. 20A is a schematic cross sectional view showing a seventh step of the manufacturing method in the HV-NMOS and HV-PMOS forming region of the semiconductor device in the first embodiment of the invention;

FIG. 20B is a schematic cross sectional view showing the seventh step of the manufacturing method in the HV-PMOS forming region for the bidirectional switch of the semiconductor device in the first embodiment of the invention;

FIG. 21A is a schematic cross sectional view showing an eighth step of the manufacturing method in the HV-NMOS and HV-PMOS forming region of the semiconductor device in the first embodiment of the invention;

FIG. 21B is a schematic cross sectional view showing the eighth step of the manufacturing method in the HV-PMOS forming region for the bidirectional switch of the semiconductor device in the first embodiment of the invention;

FIG. 21C is a schematic cross sectional view showing the eighth step of the manufacturing method in LV-NMOS and LV-PMOS forming region of the semiconductor device in the first embodiment of the invention;

FIG. 23A is a schematic cross sectional view showing a tenth step of a manufacturing method in the HV-NMOS and HV-PMOS forming region of the semiconductor device in the first embodiment of the invention;

FIG. 23B is a schematic cross sectional view showing the tenth step of the manufacturing method in the HV-PMOS forming region for the bidirectional switch of the semiconductor device in the first embodiment of the invention;

FIG. 23C is a schematic cross sectional view showing the tenth step of the manufacturing method in the LV-NMOS and LV-PMOS forming region of the semiconductor device in the first embodiment of the invention;

FIG. 25A is a schematic cross sectional view showing a 12th step of the manufacturing method in the HV-NMOS and HV-PMOS forming region of the semiconductor device in the first embodiment of the invention;

FIG. 25B is a schematic cross sectional view showing the 12th step of the manufacturing method in the HV-PMOS forming region for the bidirectional switch of the semiconductor device in the first embodiment of the invention;

FIG. 25C is a schematic cross sectional view showing the 12th step of the manufacturing method in the LV-NMOS and LV-PMOS forming region of the semiconductor device in the first embodiment of the invention;

FIG. 30A is a schematic cross sectional view showing a 17th step of the manufacturing method in the HV-NMOS and HV-PMOS forming region of the semiconductor device in the first embodiment of the invention, and FIG. 30B is a schematic cross sectional view showing the 17th step of the manufacturing method in the HV-PMOS forming region for the bidirectional switch of the semiconductor device in the first embodiment of the invention;

FIG. 30C is a schematic cross sectional view showing the 17th step of the manufacturing method in the LV-NMOS and LV-PMOS forming region of the semiconductor device in the first embodiment of the invention;

DETAILED DESCRIPTION

The present invention is to be described by way of preferred embodiments with reference to the drawings.

First Embodiment

At first, a semiconductor device in the state of a chip is to be described as this embodiment.

Figure 1:
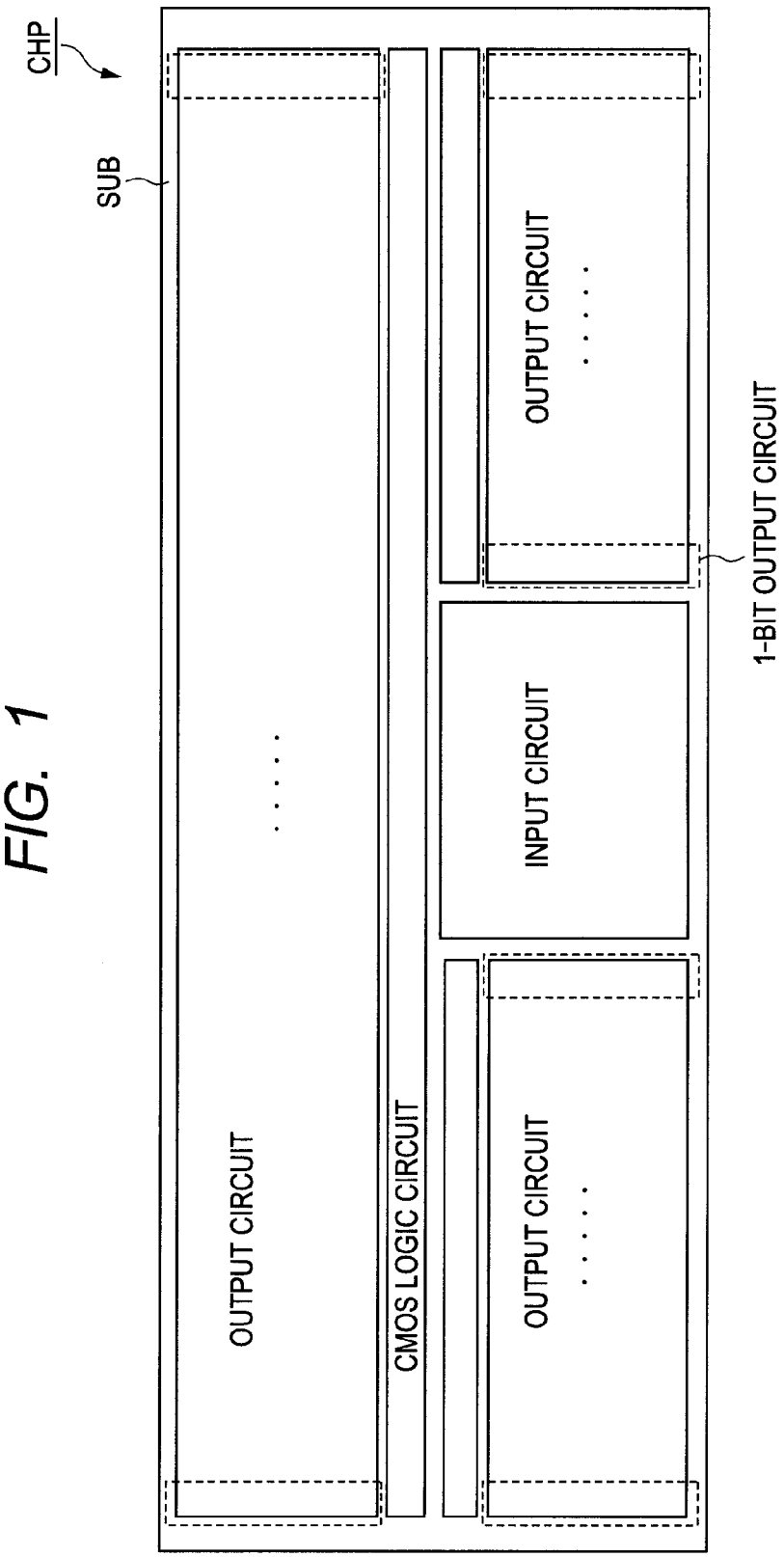
FIG. 1 is an entire plan view of a semiconductor device according to a first embodiment of the invention.

Referring to FIG. 1, a semiconductor chip CHP in this embodiment has an input circuit, output circuits, and a CMOS logic circuit. They are disposed over the main surface of a semiconductor substrate SUB.

The input circuit is a circuit for driving the CMOS (Complementary Metal Oxide Semiconductor) logic circuit and the output circuits. The CMOS logic circuit is a circuit for calculating signals when they are transmitted from the input circuit for driving the output circuits, etc. The output circuit is a circuit for outputting signals to a load coupled therewith (for example, pixels of a plasma display). That is, the terminals of the output circuit are electrically coupled with the load. The constitutional elements are arranged, for example, as shown in FIG. 1 such that a set of CMOS logic circuits are opposed over the main surface of the semiconductor substrate SUB, the output circuit is disposed to the outside of the CMOS logic circuit, and the input circuit is arranged so as to be adjacent with the output circuit.

Figure 2:
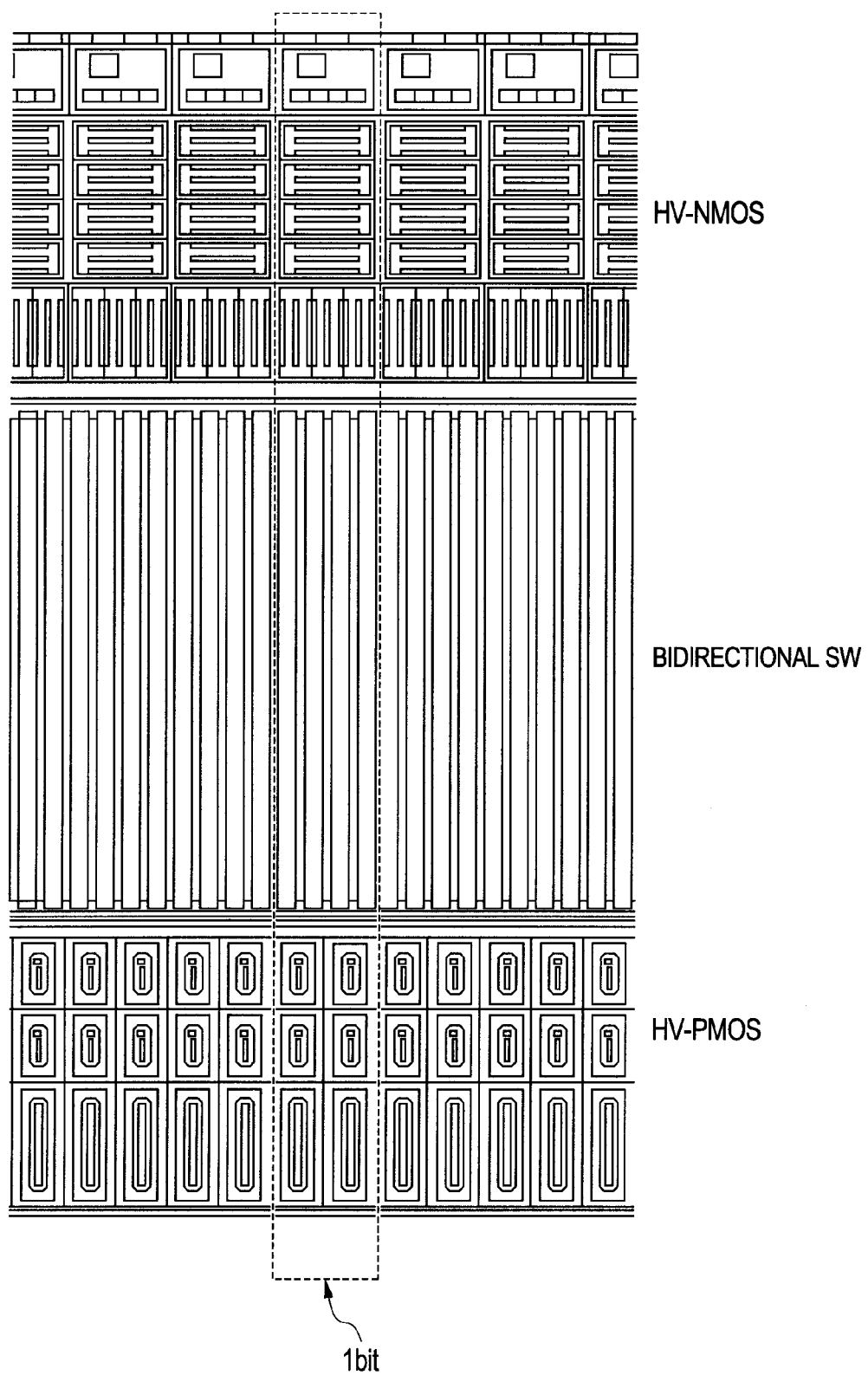
FIG. 2 is a schematic plan view showing the configuration of an output circuit in FIG. 1.

Referring to FIG. 2, an input circuit shown in FIG. 1 has, for example, multiple 1-bit output circuits assembled together. The 1 bit output circuit has a HV (High Voltage)-NMOS, a bidirectional SW (Switch), and a HV-PMOS.

Multiple high voltage n-channel type MOS transistors are arranged in the HV-NMOS. The bidirectional SW is a switch having a bidirectional switching function capable of flowing a current in a direction from one to the other and from the other to the one of a pair of main electrodes. Multiple high voltage p-channel type MOS transistors are arranged in the HV-PMOS.

The high voltage MOS transistor is a MOS transistor that can be used under application of a driving voltage higher than usual, and it specifically means a transistor having high drain withstanding voltage of 10 V or higher. As described above, the high voltage MOS transistors are preferably arranged in the output circuit of the semiconductor chip CHP.

On the other hand, the input circuit, for example, shown in FIG. 1 preferably comprises low voltage MOS transistors. The low voltage MOS transistor means a transistor that is driven at a drain voltage relatively lower than the driving voltage (drain voltage) of the high voltage MOS transistor. Specifically, the low voltage MOS transistor is driven, for example, at a drain voltage of 5 V or lower. Also the CMOS logic circuit shown in FIG. 1 is a control circuit preferably comprising, for example, multiple low voltage MOS transistors in the same manner as in the input circuit.

Figure 3:
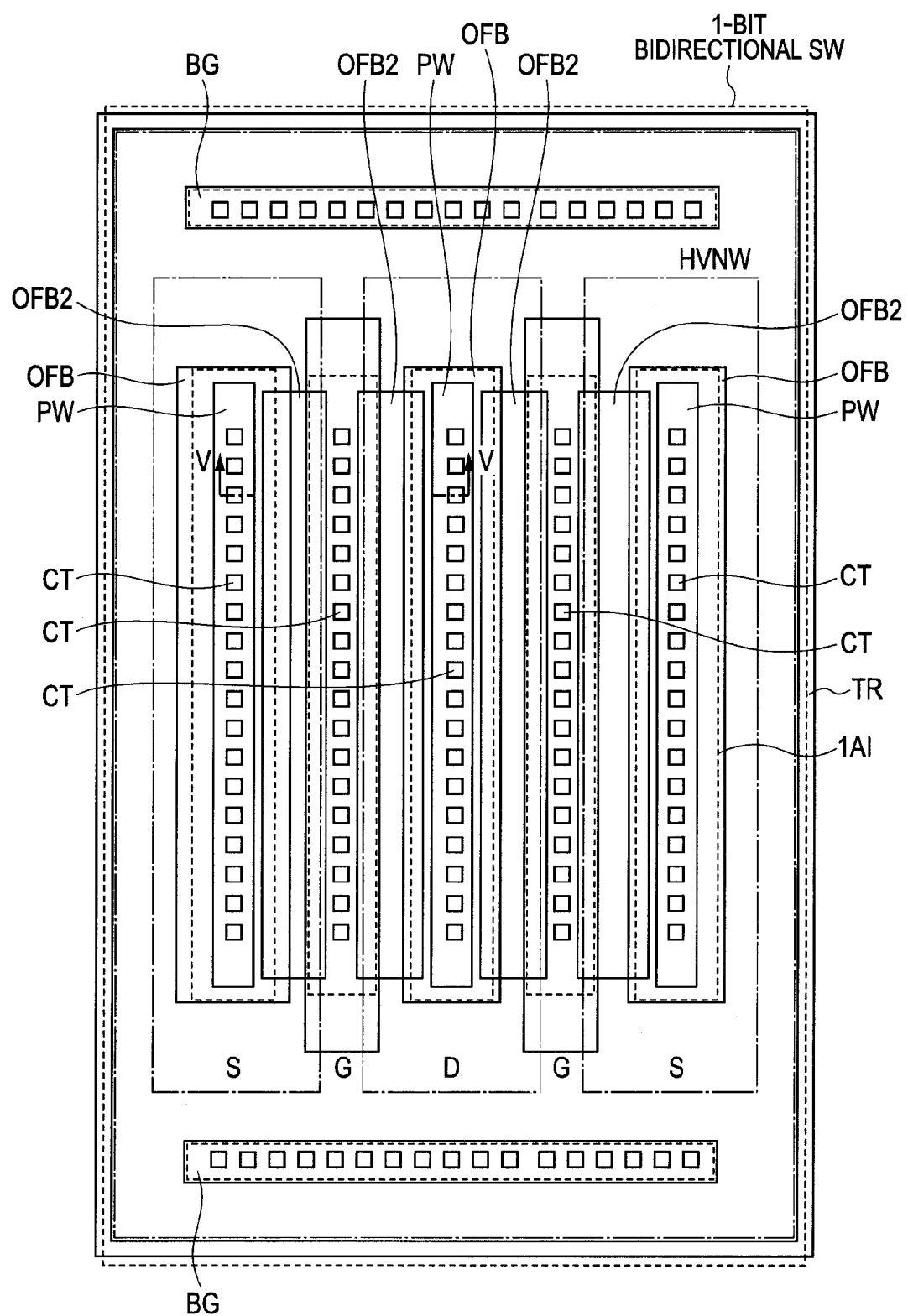
FIG. 3 is a plan view showing the details of the configuration of a bidirectional switch in FIG. 2 included in a 1 bit output circuit.

With reference to FIG. 3, high voltage MOS transistors each having a source electrode line S, a gate electrode line G, and a drain electrode line D are arranged by two rows in the right to left direction of the drawing. The number of the high voltage MOS transistors included in the 1 bit output circuit is optional. The high voltage MOS transistors having the source electrode line S, the gate electrode line G, and the drain electrode line D on the left of FIG. 3, and the high voltage MOS transistors having the source electrode line S, the gate electrode line G, and the drain electrode line D on the left of FIG. 3 share the drain electrode line D in common.

By sharing a portion of the electrode line in common between a pair of adjacent transistors, the transistor can flow a current in both directions, for example, in the direction from the drain to the source and in the direction from the source to the drain. Accordingly, the transistor has a function as a so-called bidirectional switch.

Figure 4:
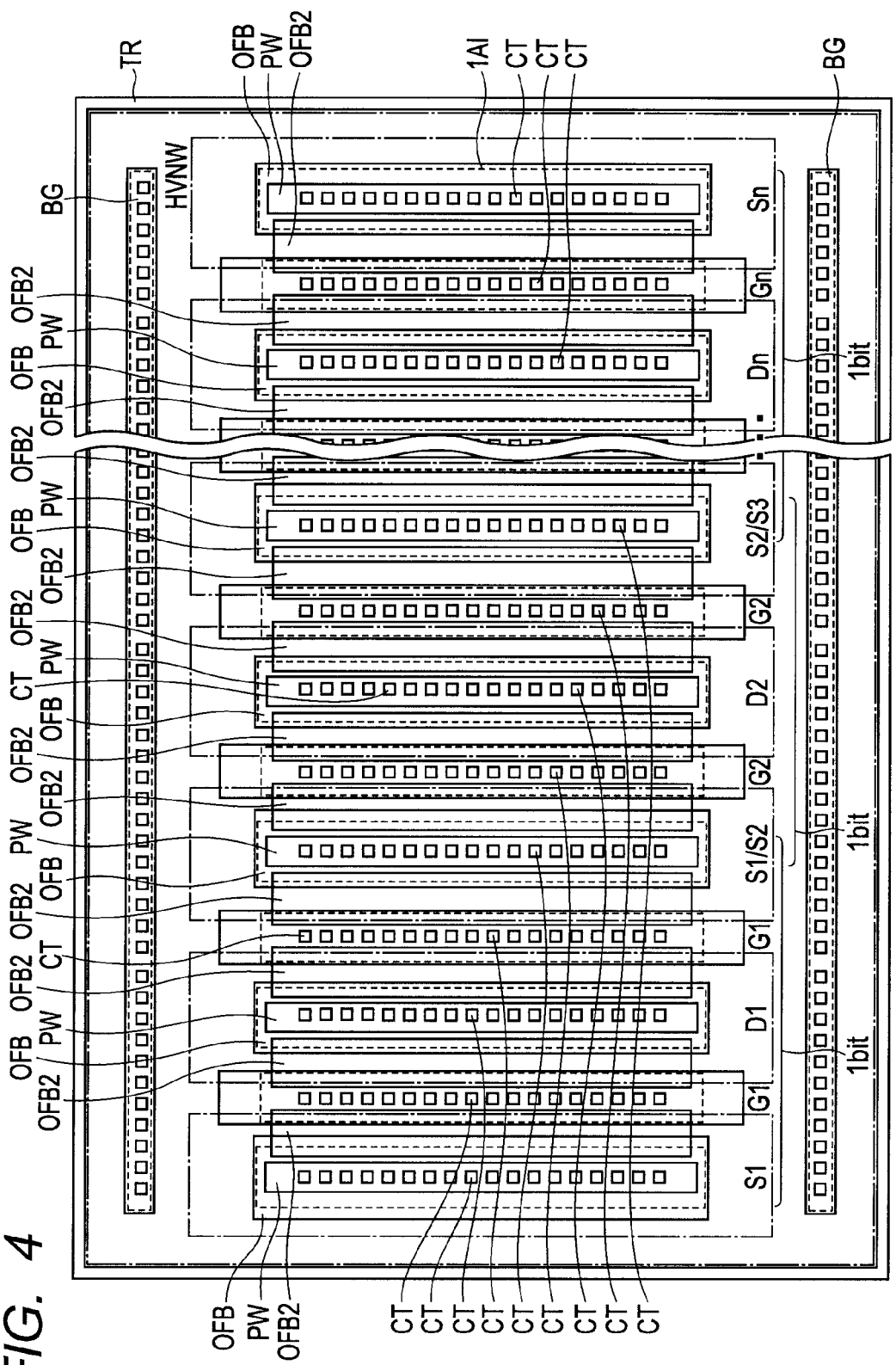
FIG. 4 is a plan view showing in details the configuration of the bidirectional switch in FIG. 2 included in the output circuit for multiple bits larger than 1 bit.

Referring to FIG. 4, in the bidirectional SW of multiple bits (for example, n bit: n is natural number), a region in which high voltage transistors each having a source electrode line S1, a gate electrode line G1, and a drain electrode line D1 are arranged by two rows in the same manner as in FIG. 3 form 1 bit, and another 1 bit adjacent to the 1 bit comprises a source electrode line S2, a gate electrode line G2, and a drain electrode line D2. The source electrode line or the drain electrode line adjacent to each of the gate electrode lines share a source electrode line or a drain electrode line in common with the transistor comprising a gate electrode line adjacent to the gate electrode line except for the source electrode lines arranged at the extreme ends in the drawing.

Figure 5:
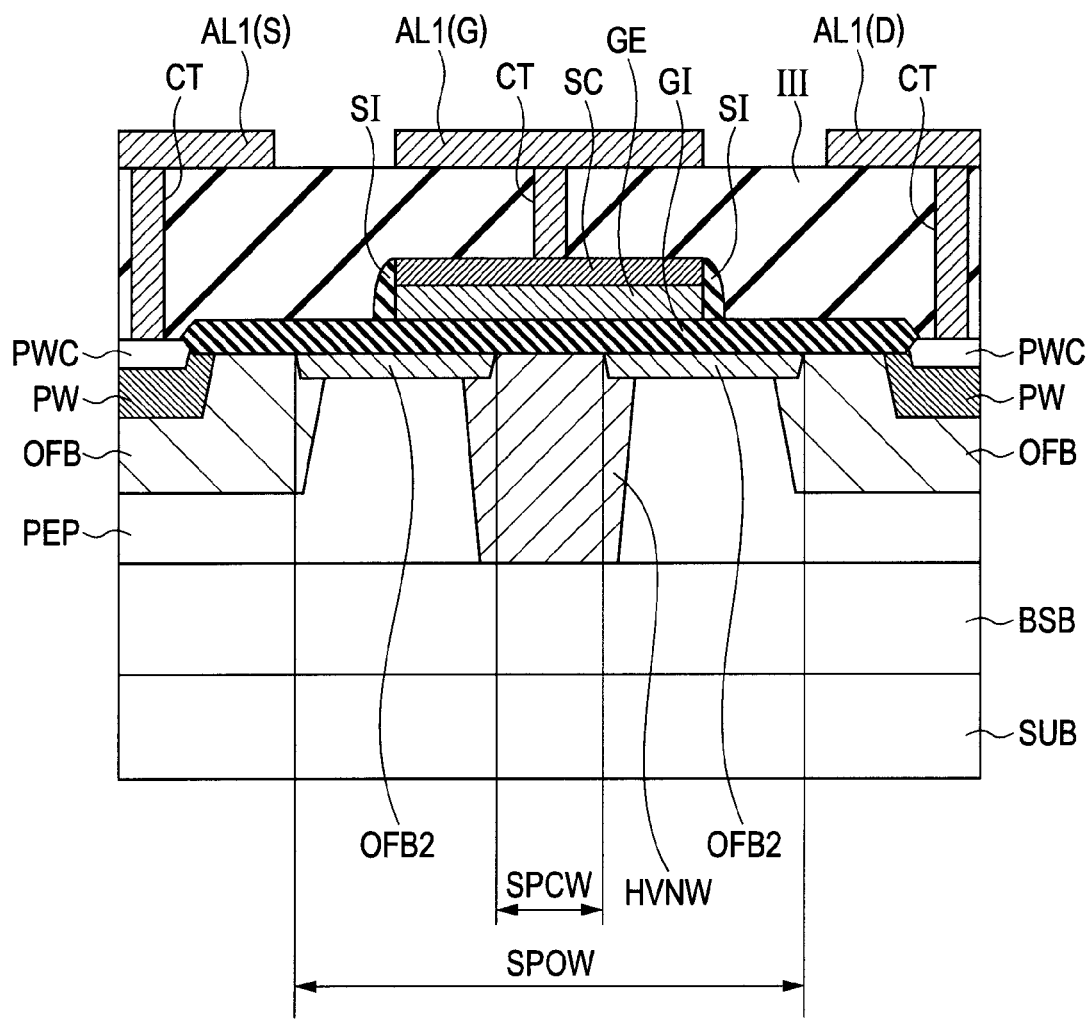
FIG. 5 is a schematic cross sectional view for a portion along line V-V in FIG. 3.

FIG. 5 is a schematic cross sectional view showing the configuration of a single high voltage MOS transistor for the bidirectional switch shown in FIG. 3. That is, in the bidirectional SW, high voltage MOS transistors having a cross sectional shape shown in FIG. 5 are arranged in plurality. Referring to FIG. 3 to FIG. 5, each of the high voltage MOS transistors in FIG. 3 and FIG. 4 is formed to the inside and on the upper surface of an epitaxial layer PEP (a first impurity layer) in contact with the upper surface of a buried diffusion layer BSB over the main surface of a semiconductor substrate SUB. Specifically, a high voltage well region HVNW (second impurity layer), a diffusion layer OFB (third impurity layer), a diffusion layer PW (fourth impurity layer), a contact diffusion layer PWC, and a diffusion layer OFB2 (fifth impurity layer) are formed over the surface of the epitaxial layer PEP. The contact diffusion layer PWC, the diffusion layer PW, and the diffusion layer OFB2 are arranged as a source region and a drain region coupled to a source electrode line S and a drain electrode line D.

The epitaxial layer PEP mainly has, over the upper surface, a gate insulation film GI, a gate electrode GE (conductive layer), and an interlayer insulation layer III. By forming the gate insulation film GI to a large thickness, for example, by a LOCOS (Local Oxidation of Silicon) method, the transistor can be made high voltage withstanding. The thickness of the gate insulation film GI in this embodiment is preferably 200 nm or more and 500 nm or less.

The source electrode line S, the gate electrode line G, and the drain electrode line D are formed each as an aluminum interconnect AL1. The aluminum interconnect AL1 is electrically coupled to the gate electrode GE and the source-drain region PWC as a lower layer by way of a conductive layer referred to as a contact layer CT formed in a layer identical with the interlayer insulation layer III. Further, silicide SC is formed over the upper surface of the gate electrode GE, and a side wall insulation film SI is formed on the lateral side of the gate electrode.

In this embodiment, the semiconductor substrate SUB, the diffusion layers OFB, PW, and OFB2 have a p-type impurity, for example, boron (B). Further, the high voltage well region HVNW and the buried diffusion layer BSB have an n-type impurity, for example, of antimony (Sb). With the configuration described above, the high voltage MOS transistor in FIG. 5 is formed as a so-called p-type channel type transistor. As described above, it is preferred that the impurity in the diffusion layers OFB, PW, and OFB2 is a first conduction type impurity, and the impurity in the high voltage well region HVNW is a second conduction type different from the first conduction type.

The high voltage well region HVNW is formed so as to reach from the uppermost surface of the epitaxial layer PEP to the buried diffusion layer BSB. Further, the high voltage well region HVNW is arranged so as to surround a single or multiple high voltage MOS transistors forming the bidirectional SW in a plan view. The high voltage well region HVNW is arranged in contiguous with a region surrounding the high voltage MOS transistor in a plan view just below the gate electrode GE of the high voltage MOS transistor (so as to overlap the gate electrode GE in a plan view).

A back gates BG is formed in a region of the high voltage well region HVNW surrounding the high voltage MOS transistor in a plan view. The back gate BG has a function as a contact for fixing the potential on the high voltage well region HVNW.

The diffusion layer OFB is arranged as a pair so as to put the high voltage well region HVNW just below the gate electrode line G between them in the high voltage MOS transistor. The diffusion layer PW is formed to the surface of the epitaxial layer PEP inside the diffusion layer OFB, and the contact diffusion layer PWC is formed on the surface of the epitaxial layer PEP inside the diffusion layer PW. The contact diffusion layer PWC is electrically coupled to the source electrode line S and the drain electrode line D.

In this embodiment, the diffusion layers OFB and the diffusion layers PW are arranged for the entire single high voltage MOS transistor such that the position and the shape are symmetrical with respect to the high voltage well region HVNW as a center. In other words, the diffusion layer OFB and the diffusion layer PW as the source region, and the diffusion layer OFB and the diffusion layer PW as the drain resin are arranged so as to be symmetrical in the shape and at symmetrical positions with respect to the gate electrode GE and the high voltage well region HVNW just therebelow as the center.

The diffusion layer OFB2 is coupled with a portion of the diffusion layer OFB and formed at the surface of the epitaxial layer PEP so as to protrude from the diffusion layer OFB and extend in the direction where the high voltage well region HVNW disposed just below the gate electrode GE is disposed. The diffusion layer OFB2 is preferably formed such that at least a portion thereof overlaps the gate electrode GE in a plan view.

In this embodiment, as shown in FIG. 5, the high voltage well region HVNW just below the gate electrode GE and the diffusion layer OFB on the left (for example, the source region) are coupled by the diffusion layer OFB2. Further, the high voltage well region HVNW just below the gate electrode GE and the diffusion layer OFB on the right (for example, the drain region) are coupled by the diffusion layer OFB2. That in this embodiment, the diffusion layers OFB2 extending along the main surface of the semiconductor substrate SUB from both of the diffusion layers OFB that put the high voltage well region HVNW just below the gate electrode GE therebetween in the direction where the high voltage well region HVNW is disposed are coupled with the high voltage well region HVNW. As described above, it is preferred that at least one of the pair of diffusion layers OFB2 is formed so as to extend from the diffusion layer OFB and coupled to the high voltage well region HVNW.

In this embodiment, the concentration of the p-type impurity in the diffusion layer PW is higher than the concentration of the p-type impurity in the diffusion layer OFB and the diffusion layer OFB2, and the concentration of the p-type impurity in the diffusion layer OFB2 is higher than the concentration of the p-type impurity in the diffusion layer OFB. That is, in this embodiment, the concentration of the p-type impurity is higher in the order of the diffusion layer PW, the diffusion layer OFB2, and the diffusion layer OFB. The contact diffusion layer PWC preferably has a concentration of the p-type impurity higher than that of the diffusion PW.

Each of the constitutional elements (region) such as the diffusion layer PW and the well region HVNW forming the high voltage MOS transistor shown in FIG. 5 can be distinguished by analyzing the difference of the concentration of the impurity or the conduction type by using SCM (Scan Charge Microscopy) or EDX (Energy Dispersive X-ray analysis).

The bidirectional SW in the output circuit is used preferably for a power recovery circuit that requires flowing of current in both directions, for example, between a load capacitance for supplying power, for example, to a plasma display device and a charge share capacitance for storing charges supplied to the load capacitance. The direction of current flowing in the circuit is opposite between the case of charging and the case of discharging the load capacitance. When the bidirectional SW is used in such a case, the flowing direction of the current can be controlled.

Figure 6:
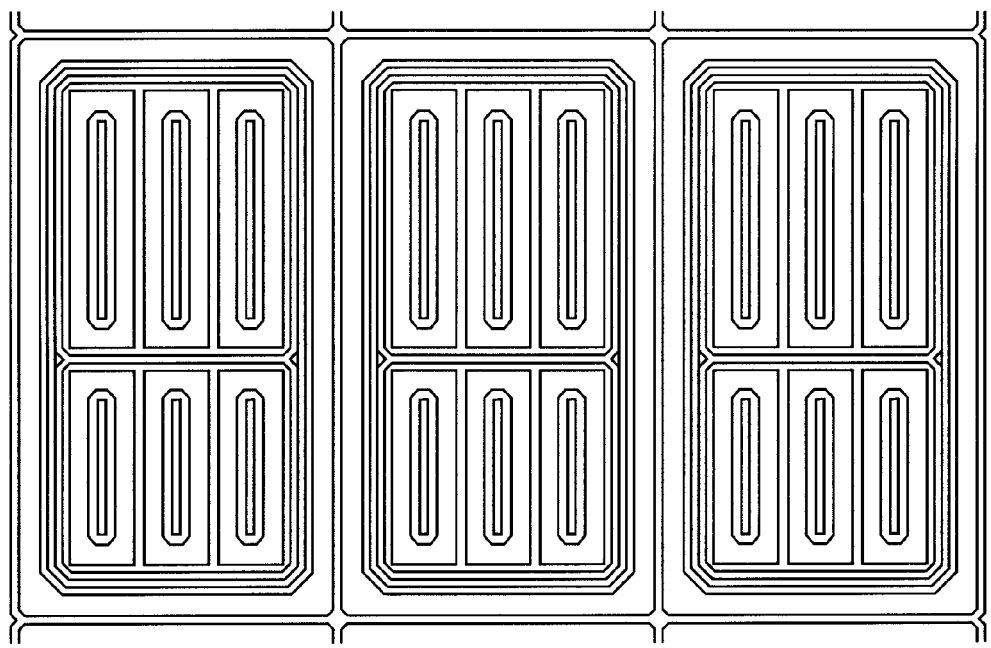
FIG. 6 is a schematic plan view showing the configuration of using a MOS transistor for a so-called unidirectional switch in the same application use as a MOS transistor for a bidirectional switch.

Referring to FIG. 6, when the high voltage MOS transistor used for a so-called unidirectional switching (unidirectional switching transistor) is used as a switching device for the current flowing in both directions (bidirectional switching transistor), the source electrode line of one transistor and the source electrode line of another transistor are preferably arranged so as to be coupled electrically. With such a configuration, even when the unidirectional switching transistor is used, the direction of the current can be controlled in both directions in the same manner as in the case of using the bidirectional switching transistor.

Use of the high voltage MOS transistor for the bidirectional switch provides an advantage capable of reducing the occupying area of the output circuit including the bidirectional SW in a plan view compared with the case of using the high voltage MOS transistor for unidirectional switching for the purpose of controlling the bidirectional current. For example, since the bidirectional switch can reduce the occupying area by about 25% in a plan view compared with the unidirectional switch, the size of the semiconductor chip or the semiconductor device can be refined further.

When transistors for the bidirectional switch are used as the bidirectional SW, the number of transistors can be decreased compared with the case of using transistors for the unidirectional switch. Therefore, by using the transistor for the bidirectional switch, the occupying area of the output circuit including the bidirectional SW can be decreased in a plan view compared with the case of using the transistors for the unidirectional switch.

Figure 7:
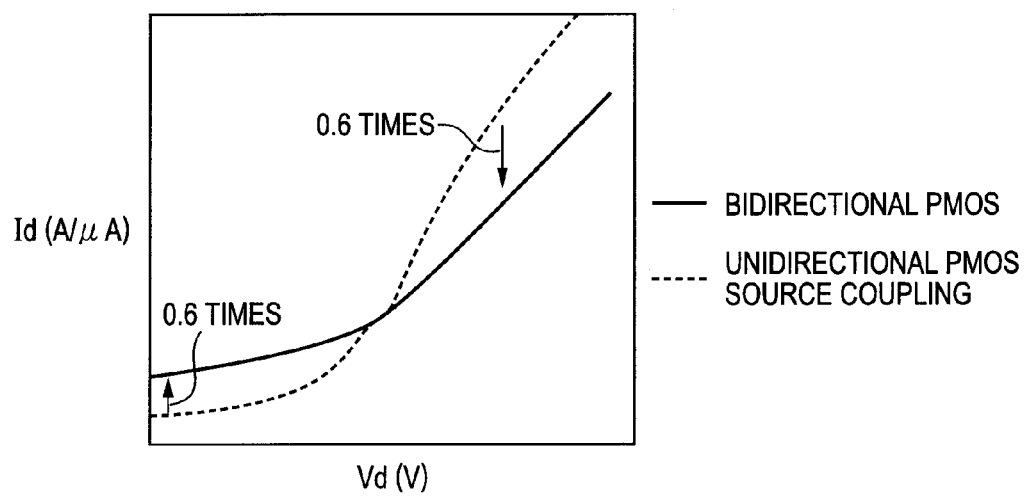
FIG. 7 is a graph showing a relation between a drain voltage and a drain current of a high voltage MOS transistor for the bidirectional switch and a high voltage MOS transistor for a unidirectional switch used as the bidirectional switch.

The abscissa on the graph in FIG. 7 represents a drain voltage applied to the high voltage MOS transistor for the unidirectional or bidirectional switch used as the bidirectional switch, and the ordinate on the graph in FIG. 7 shows a drain current flowing through the high voltage MOS transistor for the unidirectional or bidirectional switch used as the bidirectional switch. The drain voltage means a source-drain voltage in a case where the source electrode is grounded to the earth, and the drain current means current between the source and the drain.

Referring to FIG. 7, by using the high voltage MOS transistor for the bidirectional switch for the function as the bidirectional SW, while the value of the drain current flowing per individual MOS transistor is decreased as low as by about 0.6 times than in the case of using the high voltage MOS transistor for the unidirectional switch, the occupying area can be reduced in a plan view.

As described above, when the high voltage MOS transistor for the bidirectional switch is used as the bidirectional SW in the output circuit, the occupying area in the plan view can be decreased than in the case of using the high voltage MOS transistor for the unidirectional switch and, since the charges of the pixel can be utilized again by the transistor, the consumption power can be decreased.

Figure 8:
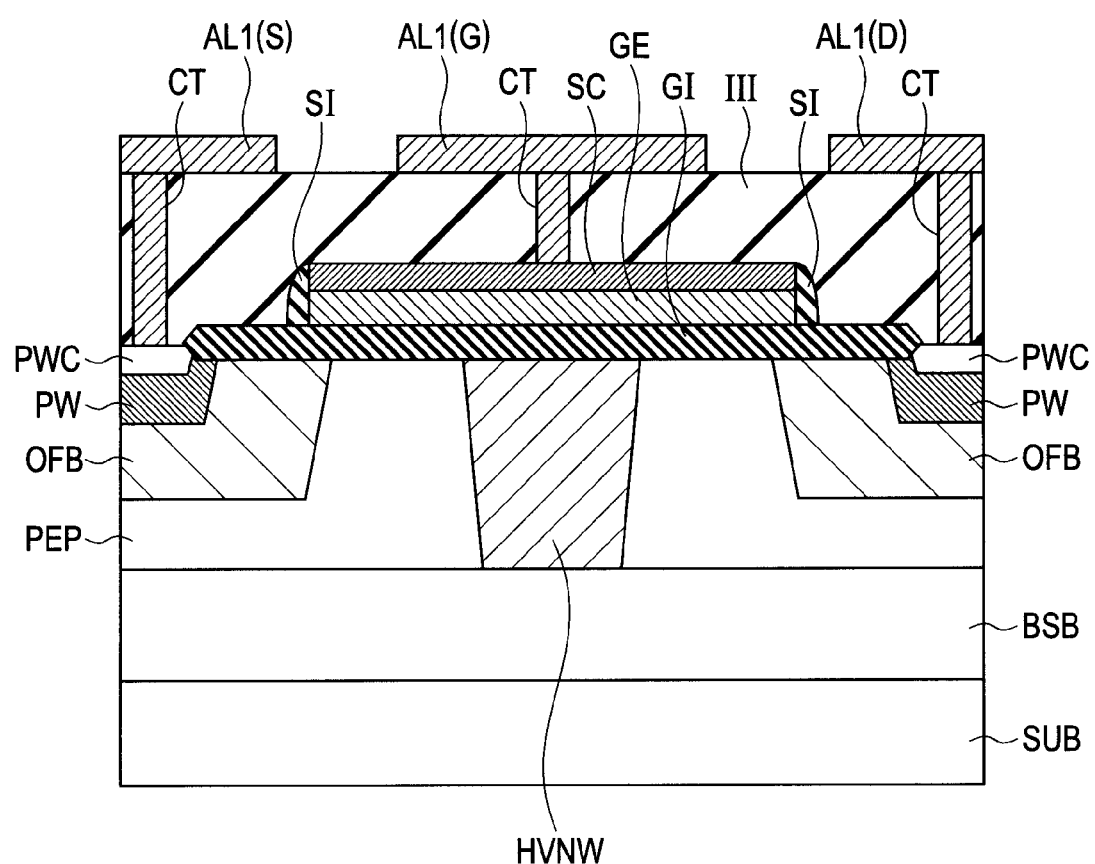
FIG. 8 is a schematic cross sectional view similar to that of FIG. 5 for a semiconductor device as a comparative embodiment for the first embodiment of the invention.

The function and the effect of this embodiment are to be described with reference to FIG. 8 to FIG. 13. Referring to FIG. 8, the high voltage MOS transistor of FIG. 8 is different from the high voltage MOS transistor in this embodiment shown in FIG. 5 in that the diffusion layer OFB2 is not formed.

Since the diffusion layer OFB2 is not formed, the distance from the diffusion layer OFB as the source region to the diffusion layer OFB as the drain region increases in the high voltage MOS transistor of FIG. 8. Accordingly, the gate electrode GE providing an electric field effect in the channel region put between the source region and the drain region is made longer than that in FIG. 5 in the left to right direction of the drawing. When the channel region put between the source region and the drain region is longer, the resistance of the channel region when the transistor is put to ON (on resistance) is increased to possibly lower the current in the channel region flowing for driving the transistor.

Figure 9:
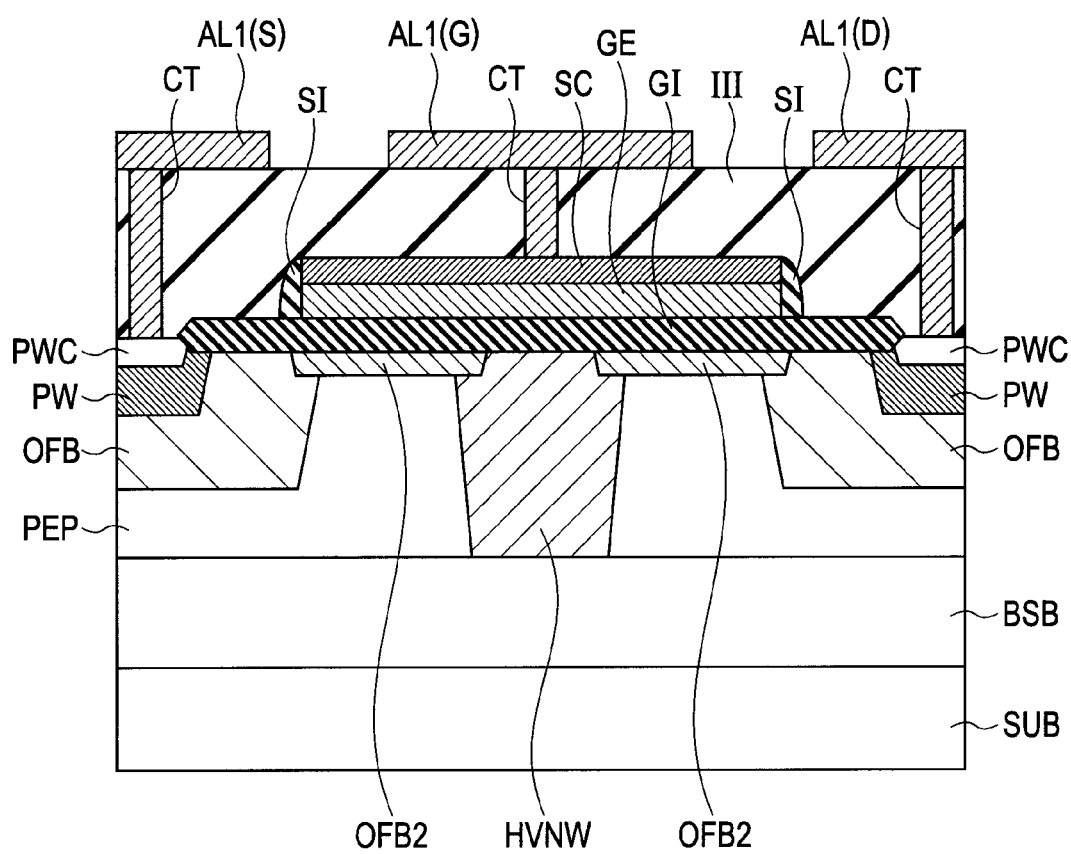
FIG. 9 is a schematic cross sectional view of a semiconductor device according to the first embodiment of the invention in comparison with that in FIG. 8.

Referring to FIG. 9, the high voltage MOS transistor in FIG. 9 has substantially the same configuration as the high voltage MOS transistor according to the embodiment shown in FIG. 5. However, in FIG. 9, the right to left length of the gate electrode GE is made identical with the length of the gate electrode GE in FIG. 8 for easy comparison with FIG. 8. When comparing the high voltage MOS transistors of FIG. 8 and FIG. 9, a diffusion layer OFB2 extends so as to protrude from a diffusion layer OFB to a well region HVMW in FIG. 9 (this embodiment). A first conduction type (p-type) impurity identical with that of the diffusion layer OFB is contained in the diffusion layer OFB2 at a concentration higher than that of the diffusion layer OFB. That is, the diffusion layer OFB2 has a function as the source region or the drain region in the same manner as the diffusion layer OFB.

Since the diffusion layer OFB2 having a resistance value lower than that of the diffusion layer OFB is disposed, the length of the channel region put between the source region and the source region is substantially equal with the length of the region put between the diffusion layers OFB2, which is shorter than the case where the diffusion layer OFB2 is not disposed. This is because the gate electrode GE is arranged so as to overlap at least a portion of the diffusion layer OFB2 in a plan view so that the region put between the pair of diffusion layers OFB becomes a channel region undergoing the electric field effect due to the gate electrode GE in the ON state. Accordingly, the ON-resistance of the transistor can be lowered, and decrease in the current in the channel region flowing for driving the transistor can be suppressed.

As will be described later, the diffusion layers PW, OFB, OFB2, and the well region HVNW are formed by implanting the impurity to the regions by using an ion implantation technique. Therefore, in each of the regions to be formed, the concentration of the impurity is higher in the region near the uppermost surface of the epitaxial layer PEP (upper side) in the drawing, and the concentration of the impurity is lowered in the deep region from the uppermost surface (lower side in the drawing). That is, the concentration of the impurity in each of the regions becomes relatively higher in the region at a height identical with that in a region where the diffusion layer OFB2 is formed (near the surface of the epitaxial layer PEP). Accordingly, the electric field effect when the transistor is put to ON can be enhanced, and a high ON current can be caused to flow more reliably.

On the other hand, the concentration of the impurity is lower in the region below the diffusion layer OFB and the well region HVNW compared with the upper region. Therefore, in this embodiment, even when the diffusion layer OFB2 is formed and the substantial channel length is shortened, a current due to the so-called punch through phenomenon can be suppressed from flowing in a region where the concentration of the impurity is low in a state where the transistor is put to OFF. As a result, lowering of the withstanding voltage in the region can be suppressed to ensure the function as the high voltage MOS transistor.

Further, the concentration of the impurity in the diffusion layer OFB is lower than the concentration of the impurity in the diffusion layer PW and the diffusion layer OFB2. Therefore, when the transistor is in the OFF state, the electric field strength in the region of the diffusion layer OFB, particularly, near the surface of the epitaxial layer PEP can be moderated. This can also suppress the lowering of the withstanding voltage when the transistor is in the OFF state.

In view of the above, in this embodiment, by forming the diffusion layer OFB2 to the high voltage MOS transistor, the transistor can be provided with high withstanding voltage and low ON-resistance. Accordingly, a transistor having both functions of high withstanding voltage and high driving current can be provided.

Particularly, in this embodiment, both of the diffusion layer OFB2 extending from the source region and the diffusion layer OFB2 extending from the drain region are present so as to be coupled with the well region HVNW. Accordingly, the effect of shortening the substantial length of the channel region can be enhanced further.

In this embodiment, the concentration of the p-type impurity in the diffusion layer OFB2 is preferably higher than the concentration of the n-type impurity in the well region HVNW. With such a configuration, the effect that the diffusion layer OFB2 as a portion of the source region substantially shortens the channel length to lower the ON-resistance can be enhanced further.

Further, since the high voltage MOS transistor is disposed symmetrically as a whole as in this embodiment, the characteristic of the driving current flowing in the ON state can be made identical irrespective of the direction of the current flowing to the transistor (from the source to the drain and from the drain to the source). Specifically, it can suppress, for example, the occurrence of such disadvantage that the current value is different greatly between the case where the driving current flows from the source to the drain and a case where the driving current flows from the drain to the source, to further decrease the difference of the current characteristic between both of the cases. Accordingly, the electric characteristic of the transistor can be stabilized more.

Figure 10:
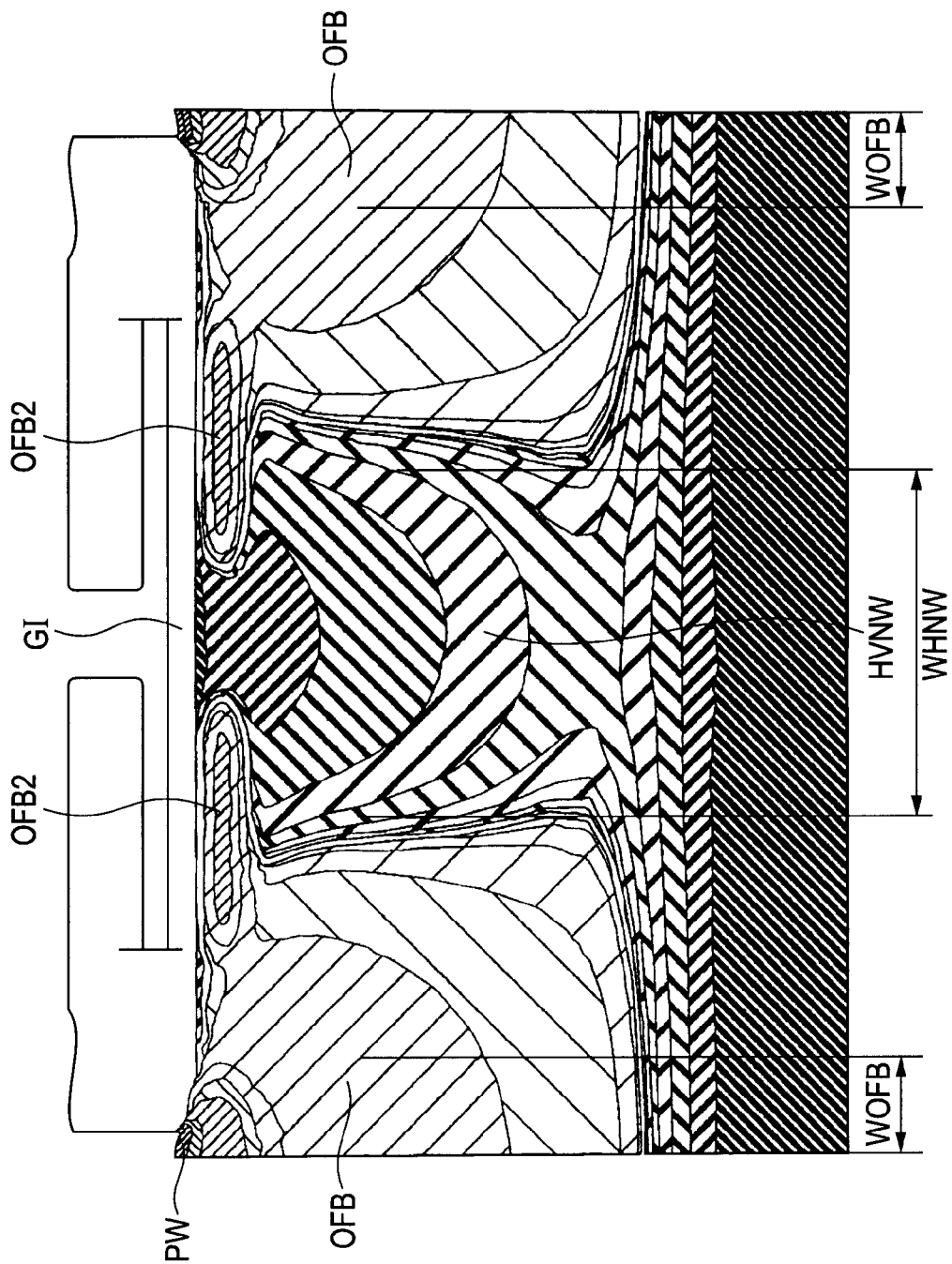
FIG. 10 is a schematic cross sectional view of an analysis model showing a configuration of the high voltage MOS transistor for the bidirectional switch according to the first embodiment of the invention and the concentration of impurity in each of the regions and used for simulation.

The effect of the high voltage MOS transistor in this embodiment is to be described with reference to the result of simulation. With reference to FIG. 10, the values of the drain current and the drain voltage (withstanding voltage) are calculated by using the analysis model for the high voltage MOS transistor for a bidirectional switch used for the bidirectional SW of this embodiment shown in FIG. 5 (FIG. 9). The shape of the analysis model in FIG. 10 is based on the cross sectional shape of the high voltage MOS transistor shown in FIG. 5 and FIG. 9. The thickness of the gate insulation film GI (vertical direction in the drawing) is defined as 300 nm.

In FIG. 10, the concentration of the impurity in a region drawn by fat hatching lines is higher than that in a region drawn by fine hatching lines. Further, in the region hatched by fat lines, the concentration of the impurity is higher in a densely hatched region than that in the thinly hatched region. In the region hatched by thin lines, the concentration of the impurity is higher in the thinly hatched region than that in the densely hatched region.

As described above, since the diffusion layer OFB and the well region HVNW are formed by using ion implantation technique, the cross sectional width in the left to right direction in the drawing is smaller in the lower side than in the upper side. The sizes WOFB and WHNW represent respectively the cross sectional widths of the regions to which implantation is conducted for the diffusion layer OFB and the well region HVNW.

Figure 11:
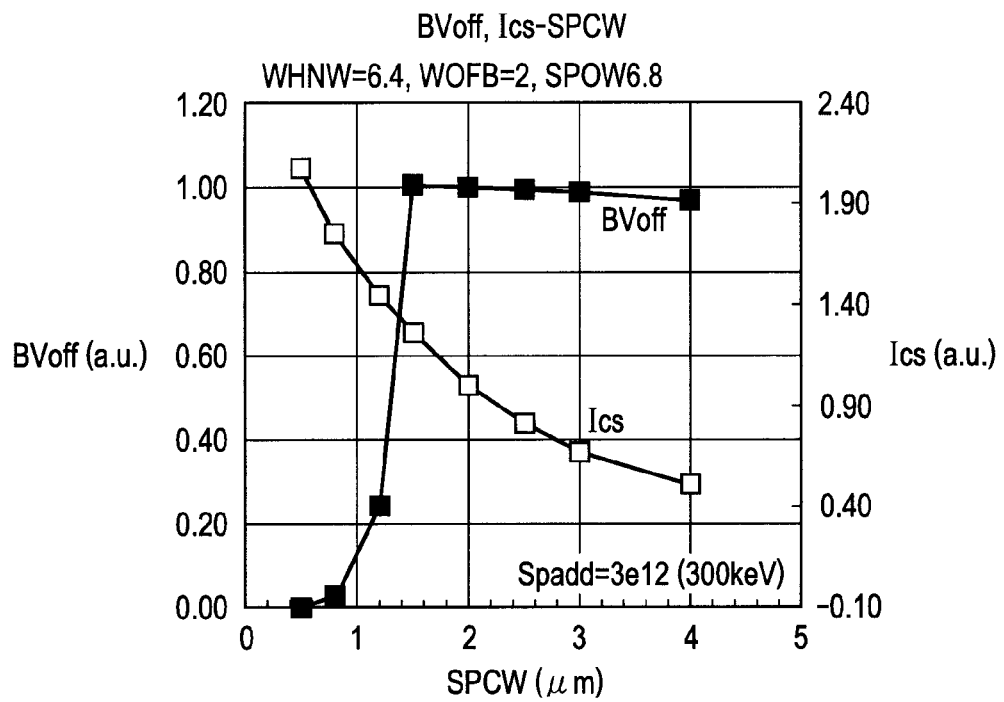
FIG. 11 is a graph showing the result of calculation for the relation between the length of a channel region, and a drain current and a drain voltage by using the analysis model shown in FIG. 10.
Figure 12:
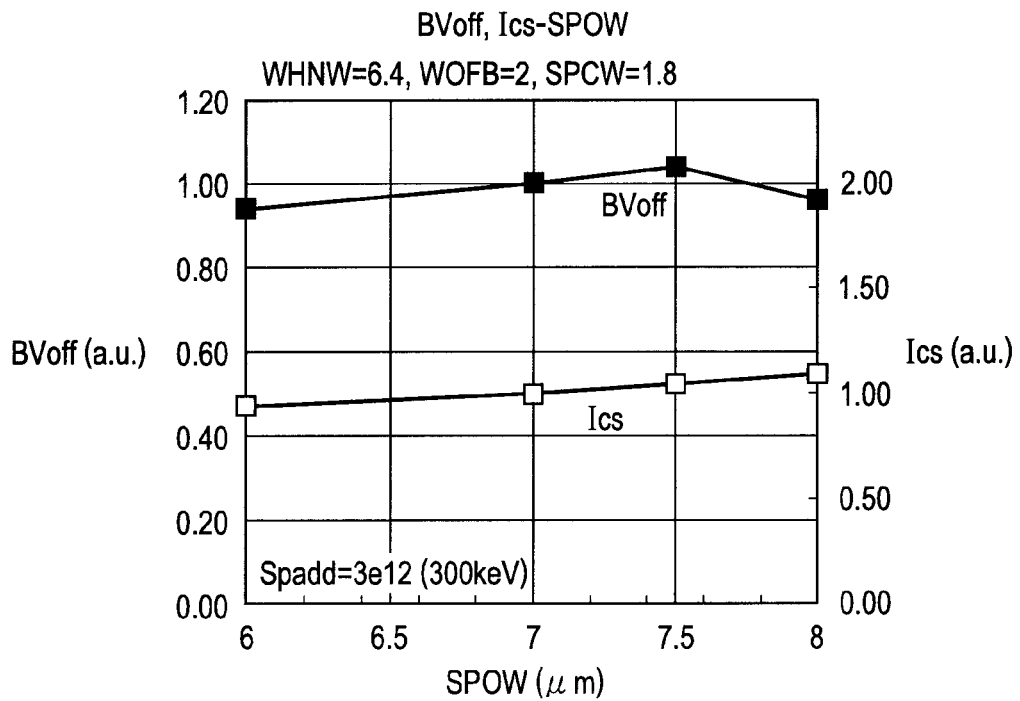
FIG. 12 is a graph showing the result of calculation for the relation of the distance between the external end of the channel region, and the drain current and the drain voltage by using the analysis model shown in FIG. 10.
Figure 13:
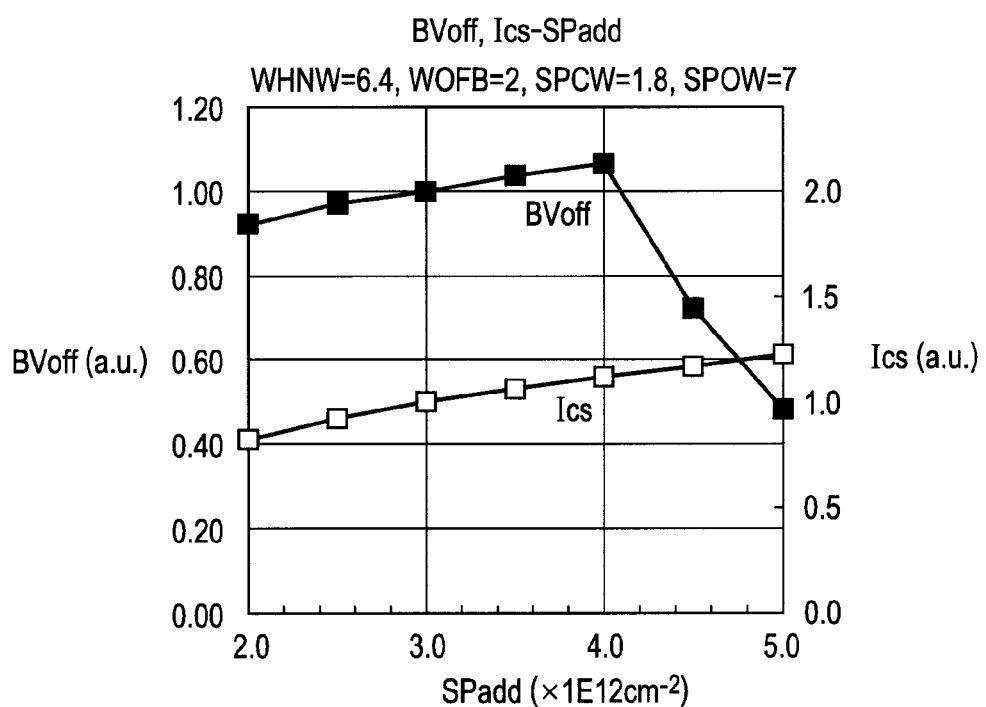
FIG. 13 is a graph showing the result of calculation for the relation between the concentration of the impurity in a diffusion layer OFB2, and the drain current and drain voltage by using the analysis model shown in FIG. 10.

In the graph of FIG. 11, the abscissa represents SPCW, that is, the shortest distance between one diffusion layer OFB2 and the other diffusion layer OFB2 (refer to FIG. 5). In the graph of FIG. 12 represents SPOW, that is, a distance between the outermost end of a diffusion layer OFB2 on one side and the outermost end of a diffusion layer OFB2 on the other side. In the graph of FIG. 13, the abscissa represents SPadd, that is, the concentration of the impurity implanted to the diffusion layer OFB2. Further, in the graphs of FIG. 11 to FIG. 13, the ordinate represents Ics, that is, a drain current flowing to the MOS transistor for the bidirectional switch, and BVoff, that is, a drain voltage (withstanding voltage) of the MOS transistor for the bidirectional switch in the OFF state each by relative values. Further, the numerical values described above each of the graphs represent the conditions such as numerical values inputted to the analysis model conducting simulation of deriving each of the graphs, with the unit of the size being based on μm.

Referring to FIG. 11, SPCW showing the substantial channel length of the high voltage MOS transistor is preferably 1.5 μm or more in view of the value of the withstanding voltage BVoff, and 2.5 μm or less in view of the value for the current Ics. In view of both of the values for BVoff and Ics, it is most preferably 2.0 μm.

Referring to FIG. 12, the values for BVoff and Ics do not change greatly even when the value SPOW is changed in a range of 6 μm or more and 8 μm or less but are kept within a range of allowable values. With reference to FIG. 13, since the value BVoff is lowered greatly when the concentration of the impurity implanted into the diffusion layer OFB2 exceeds 4E12 cm$^{-2}$, the concentration is preferably 2E12 cm$^{-2}$ or more and 4E12 cm$^{-2}$ or less and, more preferably, 3E12 cm$^{-2}$.

In view of the above, it can be said that the withstanding voltage in the OFF state can be maintained even when the shortest distance between the pair of diffusion layers OFB2 is considerably shortened (to about 1.5 μm). Further, since the withstanding voltage is lowered when the amount of ion implanted for forming the diffusion layer OFB2 is excessive, it can be said that both of the withstanding voltage and the driving current can be controlled to desired values by taking notice on the amount of the ion implantation.

Then, referring to FIG. 14 to FIG. 30, a method of manufacturing a semiconductor device according to this embodiment is to be described.

Figure 14:
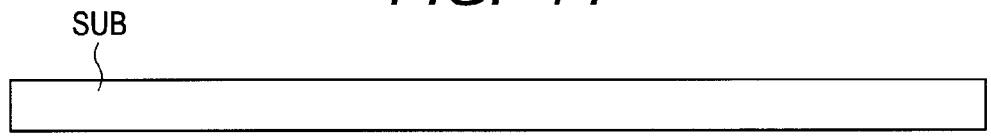
FIG. 14 is a schematic cross sectional view showing a first step of a method of manufacturing a semiconductor device in the first embodiment of the invention.

With reference to FIG. 14, a semiconductor substrate SUB having a resistivity, for example, of 1 Ωcm or more and 50 Ωcm or less is provided. The semiconductor substrate SUB is, for example, a substrate comprising a silicon single crystal containing, for example, a p-type impurity, which is used as a base for a semiconductor chip CHP (refer to FIG. 1).

Figure 15A:
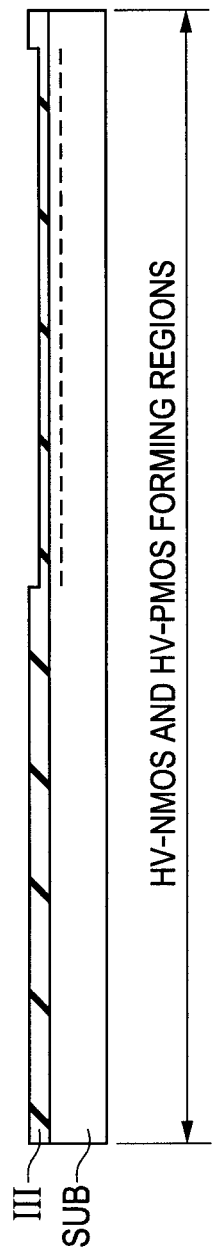
FIG. 15A is a schematic cross sectional view showing a second step of a manufacturing method in a HV-NMOS and HV-PMOS forming region of the semiconductor device in the first embodiment of the invention.
Figure 15B:
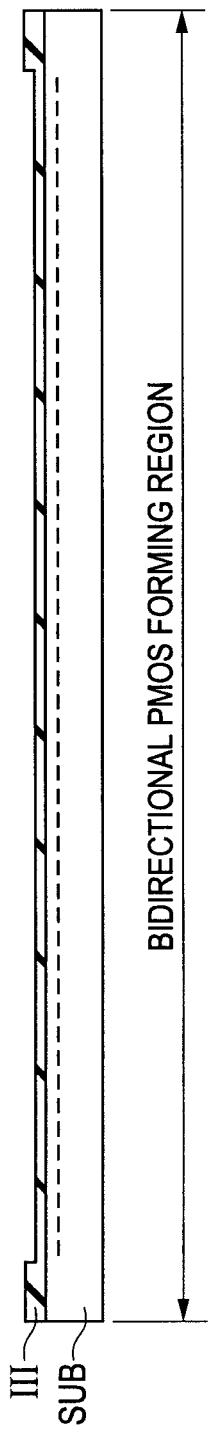
FIG. 15B is a schematic cross sectional view showing the second step of the manufacturing method in a HV-PMOS forming region for a bidirectional switch of the semiconductor device in the first embodiment of the invention.

FIG. 15 to FIG. 20 show steps for the region where HV-NMOS and HV-PMOS of the output circuit (refer to FIG. 2) are formed (FIG. 15A to FIG. 20A) and the region where the bidirectional PMOS is formed as the bidirectional SW (refer to FIG. 2) (FIG. 15B to FIG. 20B). Drawings of identical reference numbers, for example, FIG. 15A and FIG. 15B show an embodiment performing an identical step.

Referring to FIGS. 15A and 15B, an insulation layer III comprising, for example, a silicon oxide film is formed on the main surface of a semiconductor substrate SUB using, for example, a thermal oxidation method. Then, the thickness for a portion of the insulation layer III is decreased by usual photolithographic technique and an etching technique. In this step, etching is performed preferably such that the insulation layer III is somewhat thinner in a region where ions are to be implanted in the next step than in other regions.

Then, a buried diffusion layer BSB having an n-type impurity is formed to a desired region inside the semiconductor substrate SUB by a usual ion implantation technique using a patterned insulation layer III as a mask. Upon burying, antimony (Sb) is implanted, for example, at a concentration of 1E12 cm$^{-2}$ or more and 1E14 cm$^{-2}$ or less at an energy of 50 KeV or higher and 200 KeV or lower and, subsequently, the implanted impurity is diffused preferably by a subsequent heat treatment at a temperature of 1000° C. or higher and 1200° C. or lower. At and after FIG. 15, a region implanted with the n-type impurity is shown by a mark "-".

Figure 16A:
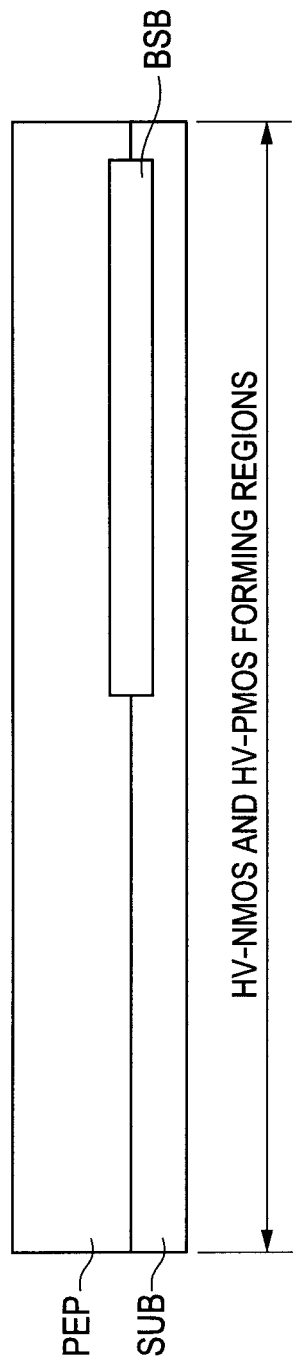
FIG. 16A is a schematic cross sectional view showing a third step of the manufacturing method in the HV-NMOS and HV-PMOS forming region of the semiconductor device in the first embodiment of the invention.
Figure 16B:
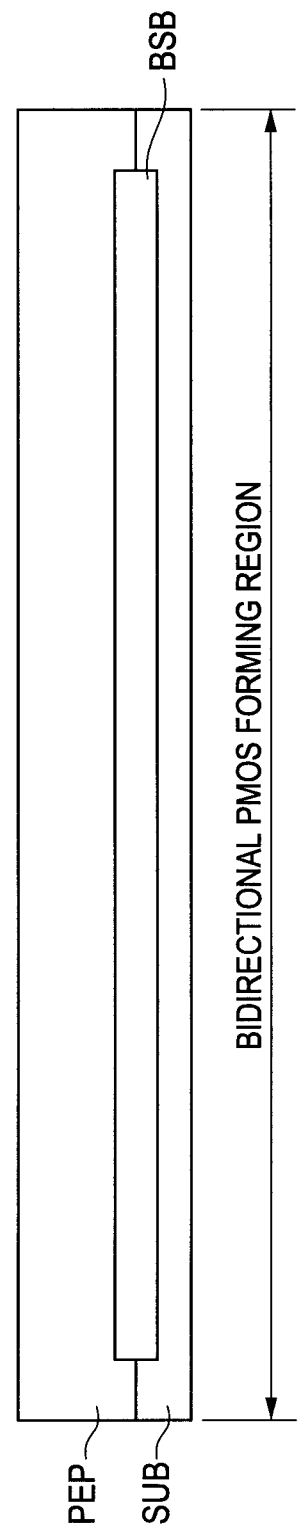
FIG. 16B is a schematic cross sectional view showing the third step of the manufacturing method in the HV-PMOS forming region for the bidirectional switch of the semiconductor device in the first embodiment of the invention.

Referring to FIGS. 16A and 16B, after removing the pattern of the insulation layer III, an epitaxial layer PEP (first impurity layer) containing, for example, a p-type impurity is formed so as to cover the upper surface of the semiconductor substrate SUB and the buried diffusion layer BSB by a usual epitaxial growing method. The epitaxial layer PEP (first impurity layer) has a resistivity preferably, for example, of 10 Ωcm or more and 30 Ωcm or less.

Referring to FIGS. 17A and 17B, an insulation layer III comprising, for example, a silicon oxide film is formed on the surface of the epitaxial layer PEP, for example, by a thermal oxidation method. Then, a photoresist PR as a photosensitive agent is coated over the insulation layer III, and the photoresist PR is patterned by a usual photolithographic technique. Then, an n-type impurity is implanted inside the epitaxial region PEP just below the region not covered by the photoresist PR by using a usual ion implantation technique using the patterned photoresist PR as a mask. In this step phosphorus (P) is implanted preferably, for example, at a concentration of 1E12 cm$^{-2}$ or more and 1E14 cm$^{-2}$ or less at an energy of 50 KeV or higher and 300 KeV or lower. In this step, damages to the surface of the epitaxial layer PEP by the implantation of the n-type impurity through the insulation layer III is preferably suppressed.

Referring to FIGS. 18A and 18B, after removing the photoresist PR in FIG. 17, a photoresist PR is again coated and the photoresist is patterned by the usual photolithographic technique in the same manner as in FIG. 17. Then, an n-type impurity is implanted inside the epitaxial layer PEP just below the region not covered by the photoresist PR by the same ion implantation technique as in FIG. 17. For example, in the step of FIG. 18, phosphorus (P) is preferably implanted in a desired region at a concentration of 1E12 cm$^{-2}$ or more and 1E13 cm$^{-2}$ or less at an energy of 200 KeV or higher and 800 KeV or lower. Accordingly, when comparing FIG. 18A and FIG. 17A, the impurity is implanted into a deeper region in the step of FIG. 18 than in the step of FIG. 17.

Referring to FIGS. 19A and 19B, a photoresist PR is coated again after removing the photoresist PR in FIG. 18, and the photoresist PR is patterned by the usual photolithographic technique in the same manner as in FIG. 17. Then, a p-type impurity is ion implanted into the epitaxial layer PEP just below the region not covered by the photoresist PR by the ion implantation technique in the same manner as in FIG. 17. In this step, a p-type impurity is implanted into a region adjacent to the region in the cross sectional view in FIG. 19 where the impurity has been implanted in the step of FIG. 17. In this step, boron (B) is, for example, implanted preferably at a concentration of $1E13\ cm^{-2}$ or more and $1E14\ cm^{-2}$ or less at an energy of 50 KeV or higher and 200 KeV or lower. In FIG. 19, the region where the p-type impurity is implanted is shown by a mark (+).

Referring to FIGS. 20A and 20B, the impurity implanted into the epitaxial layer PEP in each of the steps in FIG. 17 to FIG. 19 is heat treated at a temperature, for example, of 1000° C. or higher and 1300° C. or lower and diffused so as to be enforced downward. By the treatment, the high voltage well region HVNW having the n-type impurity, the diffusion layer OFP having the n-type impurity, and the diffusion layer OFB having the p-type impurity are formed. More specifically, the high voltage well region HVNW is a region formed by the n-type impurity implanted in the step shown in FIG. 17. The diffusion layer OFP is a region formed by the n-type impurity implanted in the step shown in FIG. 18. The diffusion layer OFB is a region formed by the p-type impurity implanted in the step shown in FIG. 19. The diffusion layer OFB shown in FIG. 20B corresponds to the diffusion layer OFB shown in FIG. 5, and the high voltage well region HMNW shown in FIG. 20B corresponds to the high voltage well region HVNW shown in FIG. 5. As described above, the high voltage well region HVNW (second impurity layer) is formed inside the epitaxial layer PEP. A pair of diffusion layers OFB (third impurity layer) is formed inside the epitaxial layer PEP so as to put the high voltage well region HVNW therebetween.

FIG. 21 to FIG. 30 show the steps for the region where HV-NMOS and HV-PMOS of the output circuit are formed (refer to FIG. 2) (FIG. 21A to FIG. 30A), the region where bidirectional PMOS is formed as the bidirectional SW (refer to FIG. 2) (FIG. 21B to FIG. 30B) and the region where the NMOS (LV-NMOS) for low voltage and a region where the low voltage PMOS (LV-PMOS) used for example in the input circuit (refer to FIG. 1) are formed (FIG. 21C to FIG. 30C). Drawings of an identical drawing number, for example, FIG. 21A, FIG. 21B, and FIG. 21C show the embodiments for which an identical step is conducted.

Referring to FIGS. 21A to 21C, a field oxide film FO comprising, for example, a silicon oxide film is formed, for example, by a usual LOCOS method. The field oxide film FO is an insulation layer formed for electric insulation between adjacent constitutional elements (regions) with respect in the direction along the uppermost surface of the epitaxial layer PEP in each of the regions where the high voltage (HV) MOS transistor is formed (refer to FIGS. 21A and 21B) and a region where the low voltage (LV) MOS transistor is formed (refer to FIG. 21C). Further, the field oxide film FO is preferably formed as the gate oxide film of an MOS transistor to be formed (for example, gate insulation film GI in FIG. 5) particularly in a region where the high voltage (HV) MOS transistor is formed (refer to FIGS. 21A and 21B). However, the field oxide film FO (gate insulation film GI in the high voltage MOS transistor) may also be formed, for example, by using a usual CVD (chemical vapor deposition) method without using LOCOS method.

In FIGS. 21A to FIG. 30A, the region where the high voltage NMOS transistor is formed is shown by HV-N and the region where the high voltage PMOS transistor is formed is shown as HV-P. In FIG. 21C to FIG. 30C, the region where the low voltage NMOS transistor is formed is shown by LV-N and the region where the low voltage transistor is formed is shown by shown as LV-P.

Figures 22A, 22B, 22C:
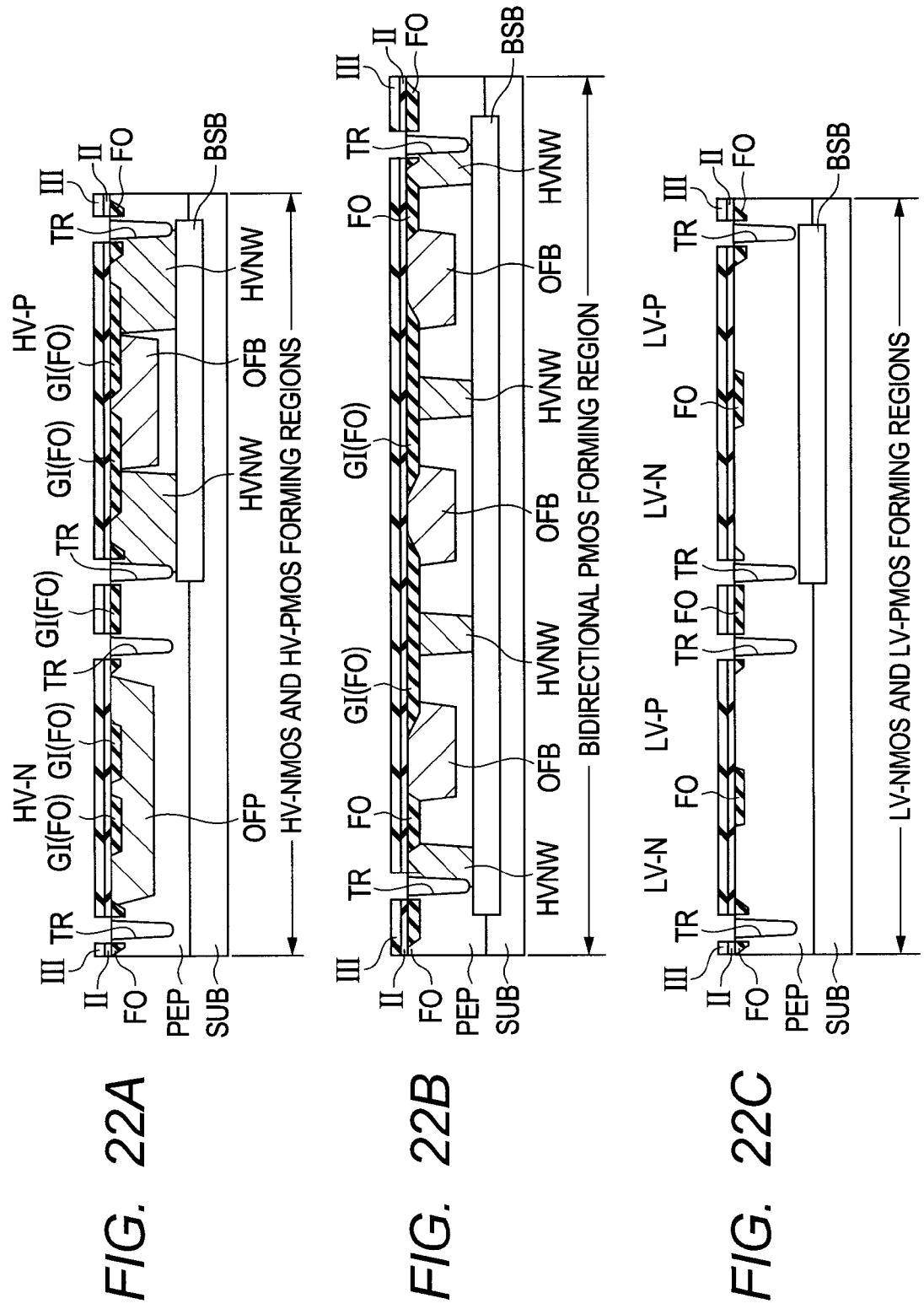
FIG. 22A is a schematic cross sectional view showing a ninth step of the manufacturing method in the HV-NMOS and HV-PMOS forming region of the semiconductor device in the first embodiment of the invention.
FIG. 22B is a schematic cross sectional view showing the ninth step of the manufacturing method in the HV-PMOS forming region for the bidirectional switch of the semiconductor device in the first embodiment of the invention.
FIG. 22C is a schematic cross sectional view showing the ninth step of the manufacturing method in the LV-NMOS and LV-PMOS forming region of the semiconductor device in the first embodiment of the invention.

With reference to FIGS. 22A to 22C, a silicon oxide film and a silicon nitride film formed by a thermal oxidation method, and a silicon oxide film formed by a CVD method are formed at first as protection films so that they are stacked in this order. In FIG. 22, the silicon oxide film formed by the thermal oxidation method is shown by a symbol II, and the silicon nitride film and the silicon oxide film formed by the CVD method are collectively shown as the insulation layer III. Then, the protective films are patterned by usual photolithographic technique and etching technique. Further, a trench TR is etched from the uppermost surface of the epitaxial layer PEP to a depth, for example, reaching the buried diffusion layer BSB. The trench TR is formed for isolating, for example, a region where the buried diffusion layer BSB is formed or a region where the bidirectional SW is formed from other regions.

Referring to FIGS. 23A to 23C, after forming the insulation layer III comprising the silicon oxide film by the thermal oxidation method to the inner wall surface of the trench TR, a polycrystal silicon film PY or the like is filled inside the trench TR. In this treatment, the CVD method, for example, is used. Then, the polycrystal silicon film formed over the upper surface of the epitaxial layer PEP is removed, for example, by using a usual etching technique, and the region on the upper surface of the polycrystal silicon film PY inside the trench TR is oxidized. Subsequently, the protective films formed in the step of FIG. 22 are removed.

Figures 24A, 24B, 24C:
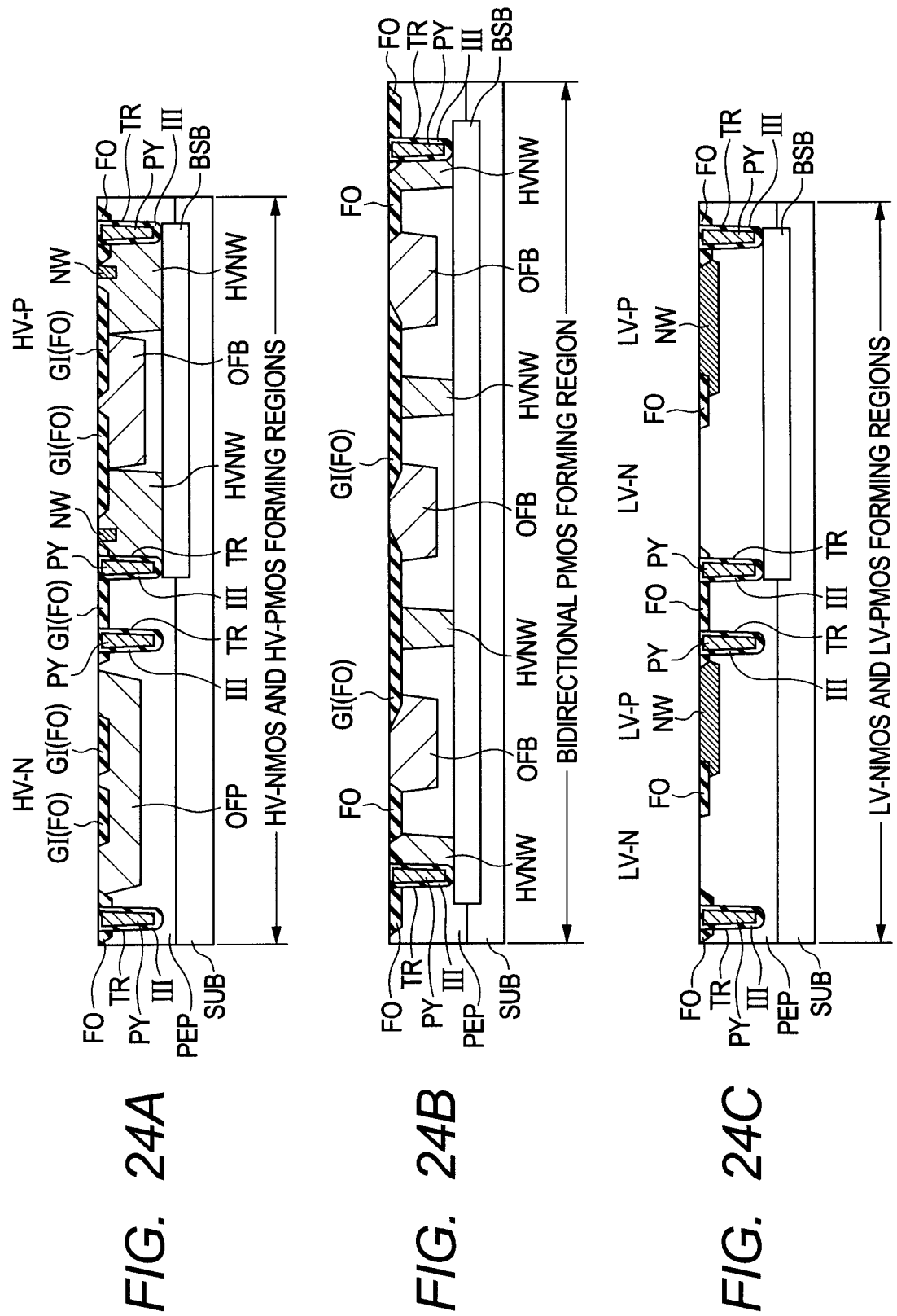
FIG. 24A is a schematic cross sectional view showing a 11th step of the manufacturing method in the HV-NMOS and HV-PMOS forming region of the semiconductor device in the first embodiment of the invention.
FIG. 24B is a schematic cross sectional view showing the 11th step of the manufacturing method in the HV-PMOS forming region for bidirectional switch of the semiconductor device in the first embodiment of the invention.
FIG. 24C is a schematic cross sectional view showing the 11th step of the manufacturing method in the LV-NMOS and LV-PMOS forming region of the semiconductor device in the first embodiment of the invention.

Referring to FIGS. 24A to 24C, a diffusion layer NW is formed in a desired region of the epitaxial layer PEP by a usual photolithographic technique and an ion implantation technique, for example, in a HV-NMOS and HV-PMOS forming region and LV-NMOS and LV-PMOS forming region. The diffusion layer NW is a region having the n-type impurity formed while using a thin film formed on the surface of the epitaxial layer PEP as a mask (protective film) by using, for example, the ion implantation technique in the same manner as in the step 15. For example, phosphorus (P) is implanted, preferably, at a concentration of $1E12\ cm^{-2}$ or more and $1E14\ cm^{-2}$ or less at an energy of 15 KeV or higher and 800 KeV or lower by using different energy levels in a multi-stage.

Referring to FIGS. 25A to 25C, a diffusion layer PW is formed in a desired region of the epitaxial layer PEP. The diffusion layer PW is formed by using the same usual photolithographic technique and the ion implantation technique as in the step of FIG. 24. For example, boron (B) is preferably implanted in this step at a concentration of $1E12\ cm^{-2}$ or more and $1E14\ cm^{-2}$ or less at an energy of 10 KeV or higher and 500 KeV or lower by using different energy levels in a multi-stage. The diffusion layer PW shown in FIG. 25B corresponds to the diffusion layer PW shown in FIG. 5. As described above, a pair of diffusion layers PW (fourth impurity layer) are formed inside the diffusion layer OFB.

Figures 26A, 26B, 26C:
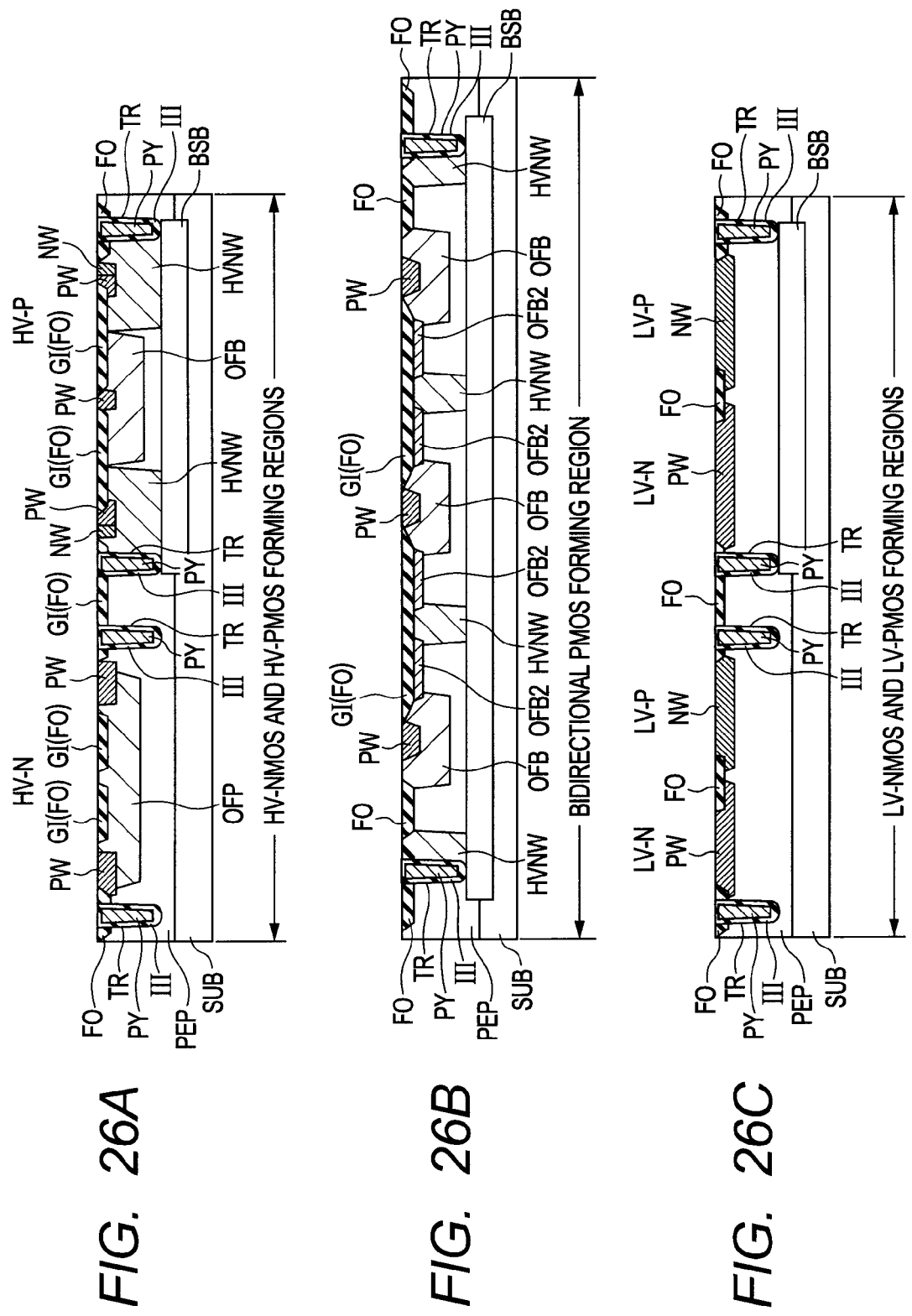
FIG. 26A is a schematic cross sectional view showing a 13th step of the manufacturing method in the HV-NMOS and HV-PMOS forming region of the semiconductor device in the first embodiment of the invention.
FIG. 26B is a schematic cross sectional view showing the 13th step of the manufacturing method in the HV-PMOS forming region for the bidirectional switch of the semiconductor device in the first embodiment of the invention.
FIG. 26C is a schematic cross sectional view showing the 13th step of the manufacturing method in the LV-NMOS and LV-PMOS forming region of the semiconductor device in the first embodiment of the invention.

Referring to FIG. 26B, a diffusion layer OFB2 (fifth impurity layer) is formed in a desired region at the surface (uppermost surface) of the epitaxial layer PEP in the bidirectional PMOS forming region. In this step, the diffusion layer OFB2 is preferably formed so as to protrude from the diffusion layer OFB (along the main surface of the substrate SUB) so that the diffusion layer directs in the direction where the high voltage well region HVNW is disposed just below a gate electrode GE, and the diffusion layer OFB2 may also be coupled to the high voltage well region HVNW disposed just below the gate electrode GE. At least one of the pair of diffusion layers OFB2 is preferably formed so as to extend from the diffusion layer OFB and be coupled to the high voltage well region HVNW.

In FIG. 26B, both of the diffusion layers OFB2 are formed so as to couple the diffusion layer OFB and the high voltage well region HVNW.

The diffusion layer OFB2 is formed by using the same ion implantation technique as in the step of FIG. 24 and FIG. 25. In this step boron (B) is, for example, implanted preferably to a concentration of $1E12\ cm^{-2}$ or more and $1E13\ cm^{-2}$ or less at an energy of 100 KeV or higher and 800 KeV or lower. The diffusion layer OFB2 shown in FIG. 26B corresponds to the diffusion layer OFB2 shown in FIG. 5.

The diffusion layer is formed preferably such that the concentration of the impurity in the diffusion layer PW is higher than the concentration of impurity in the diffusion layer OFB and the diffusion layer OFB2, and the concentration of the impurity in the diffusion layer OFB2 is higher than the concentration of the impurity in the diffusion layer OFB. Further, the diffusion layer OFB2 is formed preferably such that p-type concentration of the impurity in the diffusion layer OFB2 is higher than the n-type concentration of the impurity in the well region HVNW.

In this embodiment, it is preferred that the impurity in the diffusion layers OFB, PW, OFB2 is first conduction type impurity and the impurity in the high voltage well region HVNW is the impurity of the second conduction type different from the first conduction type.

In this embodiment, the diffusion layer OFB and the diffusion layer PW are preferably disposed such that the position and the shape are symmetrical with respect to the high voltage well region HVNW in the entire single high voltage MOS transistor.

In this embodiment, the diffusion layer OFB2 is preferably formed such that at least a portion thereof overlaps the gate electrode GE in a plan view.

In this step, since the treatment need not be applied in the HV-NMOS and HV-PMOS forming region, and the LV-NMOS and LV-PMOS forming region, FIG. 26A and FIG. 26C are illustrated in the same manner as FIG. 25A and FIG. 25C, respectively.

For the diffusion layer OFB2 shown in FIG. 26B, the order of the steps may be changed in the state after forming the field oxide film FO (gate insulation film GI) shown in FIG. 21 and before forming the gate electrode GE to be shown subsequently. That is, the diffusion layer OFB2 shown in FIG. 263 may be formed just after any of the steps shown in FIG. 21 to FIG. 25.

Figure 27A:
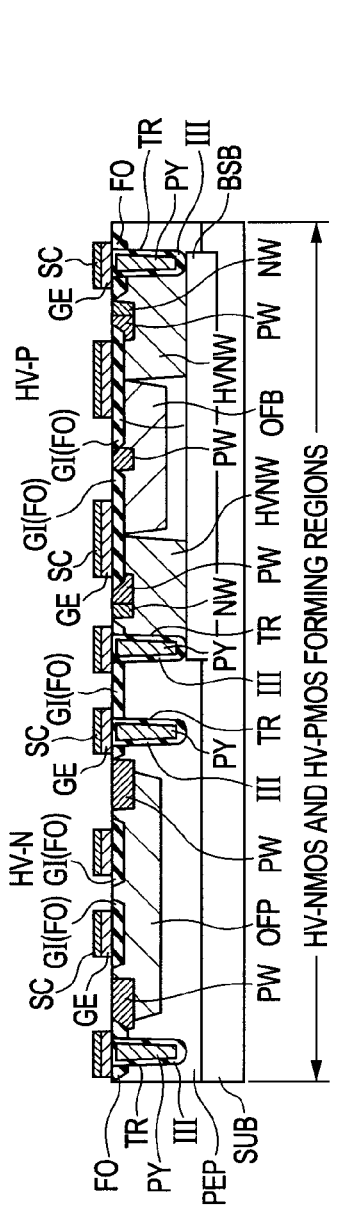
FIG. 27A is a schematic cross sectional view showing a 14th step of the manufacturing method in the HV-NMOS and HV-PMOS forming region of the semiconductor device in the first embodiment of the invention.
Figure 27B:
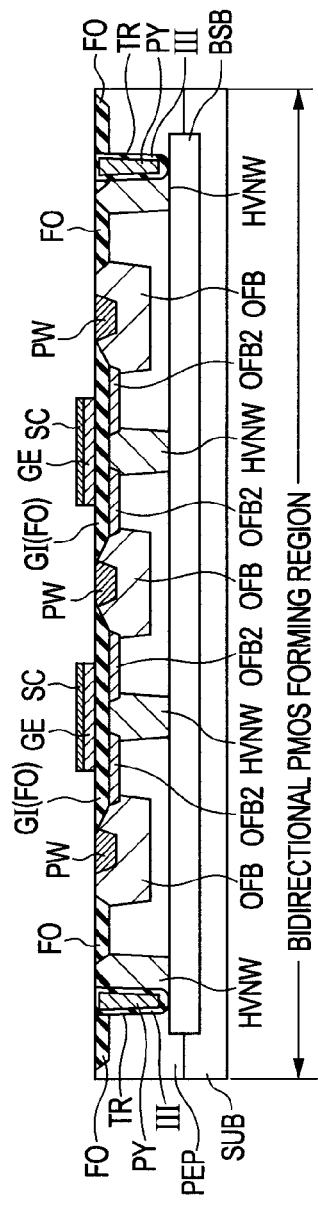
FIG. 27B is a schematic cross sectional view showing the 14th step of a manufacturing method in the HV-PMOS forming region for the bidirectional switch of the semiconductor device in the first embodiment of the invention.
Figure 27C:
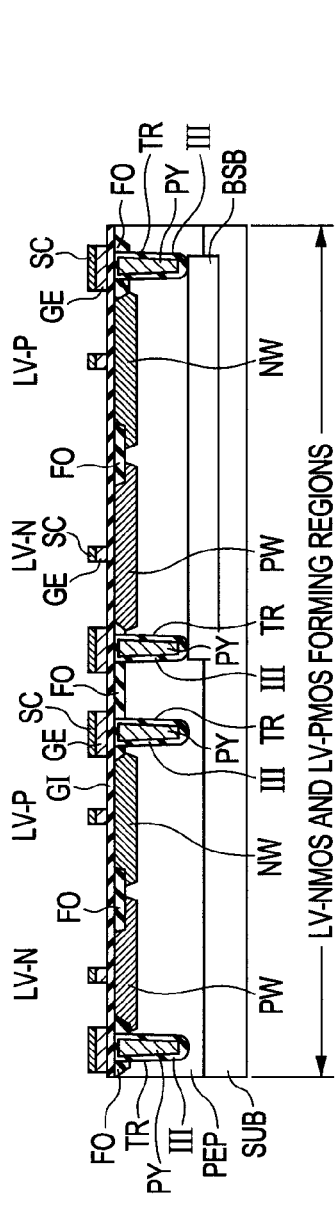
FIG. 27C is a schematic cross sectional view showing the 14th step of the manufacturing method in the LV-NMOS and LV-PMOS forming region of the semiconductor device in the first embodiment of the invention.

Referring to FIG. 27C, a gate insulation film GI formed in a LV-NMOS and LV-PMOS forming region is formed at first, for example, by a thermal oxidation method. Then, referring to FIG. 27A to FIG. 27C, a thin polycrystal silicon film is formed by a CVD method and, further, a thin WSi film is formed by a sputtering method. Then, the thin polycrystal silicon and WSi films are patterned by a usual photolithographic technique and an etching technique. A structure where the polycrystal silicon pattern GE and WSi pattern SC are stacked is formed as a gate electrode.

Then, a so-called LDD (lightly doped drain) region is formed, particularly, in the LV-NMOS and LV-PMOS forming region by using the usual photolithographic technique and ion implantation technique shown in FIG. 24 and FIG. 25 although not illustrated. Specifically, the LDD region is formed by implanting, for example, boron (B) to a concentration of $1E13\ cm^{-2}$ or more and $1E14\ cm^{-2}$ or less at an energy of 10 KeV or higher and 50 KeV or lower and, further, implanting, for example, phosphorus (P) to a concentration of $1E13\ cm^{-2}$ or more and $1E14\ cm^{-2}$ or less at an energy of 10 KeV or higher and 30 KeV or lower.

Figure 28A:
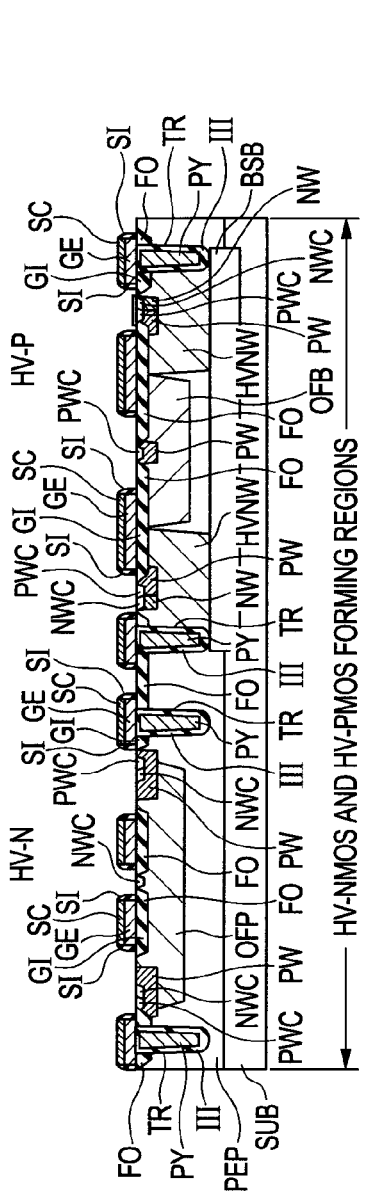
FIG. 28A is a schematic cross sectional view showing a 15th step of the manufacturing method in the HV-NMOS and HV-PMOS forming region of the semiconductor device in the first embodiment of the invention.
Figure 28B:
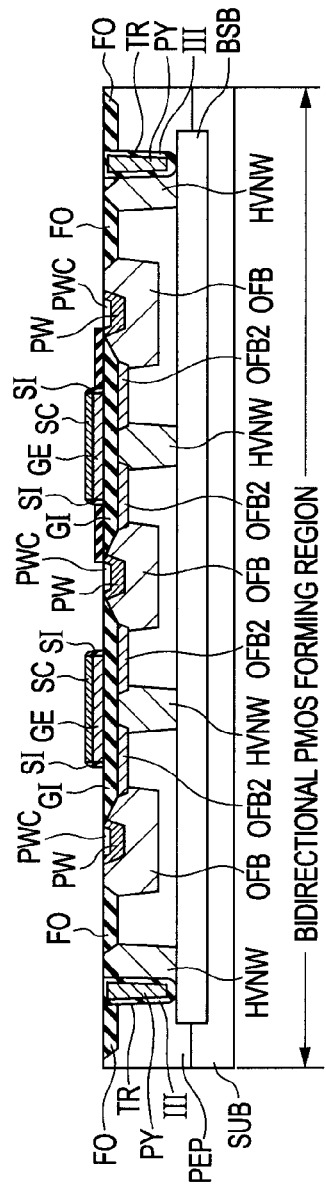
FIG. 28B is a schematic cross sectional view showing the 15th step of the manufacturing method in the HV-PMOS forming region for the bidirectional switch of the semiconductor device in the first embodiment of the invention.
Figure 28C:
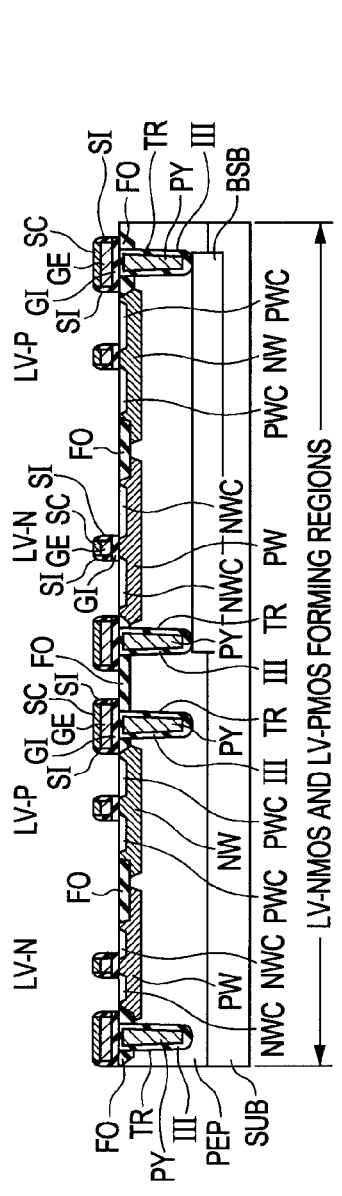
FIG. 28C is a schematic cross sectional view showing the 15th step of the manufacturing method in the LV-NMOS and LV-PMOS forming region of the semiconductor device in the first embodiment of the invention.

Referring to FIG. 28A to FIG. 28C, a side wall insulation layer SI as a side wall of the gate electrode GE is formed by forming the silicon oxide film by a CVD method and then etching back the same.

Further, an n-type contact diffusion layer NWC and a p-type contact diffusion layer PWC are formed respectively by using a usual photolithographic technique and ion implantation technique respectively. The contact diffusion layer NWC is formed by ion implanting, for example, arsenic (As) to a concentration of $1E13\ cm^{-2}$ or more and $1E16\ cm^{-2}$ or less at an energy of level 10 KeV or higher and 100 KeV or lower. The contact diffusion layer PWC is formed by implanting, for example, boron (B) to a concentration of $1E13\ cm^{-2}$ or more and $1E16\ cm^{-2}$ or less at an energy level of 10 KeV or higher and 100 KeV or lower.

Figure 29A:
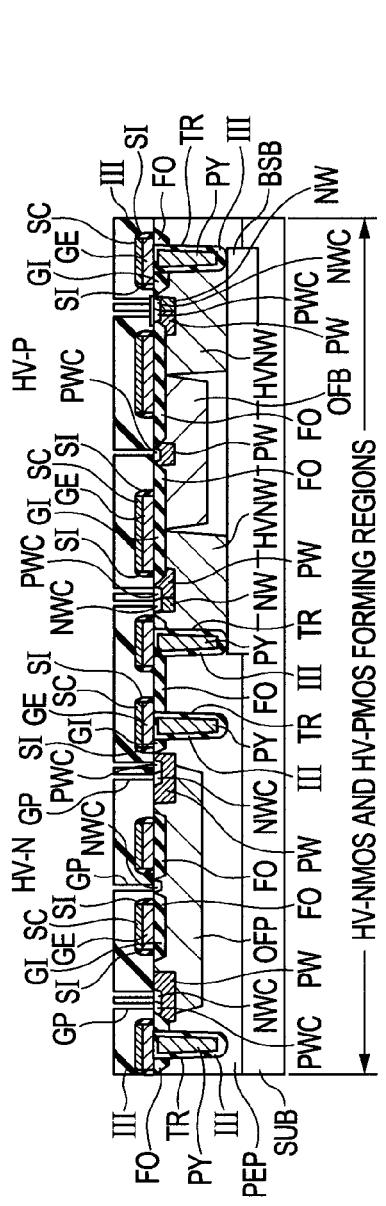
FIG. 29A is a schematic cross sectional view showing a 16th step of the manufacturing method in the HV-NMOS and HV-PMOS forming region of the semiconductor device in the first embodiment of the invention.
Figure 29B:
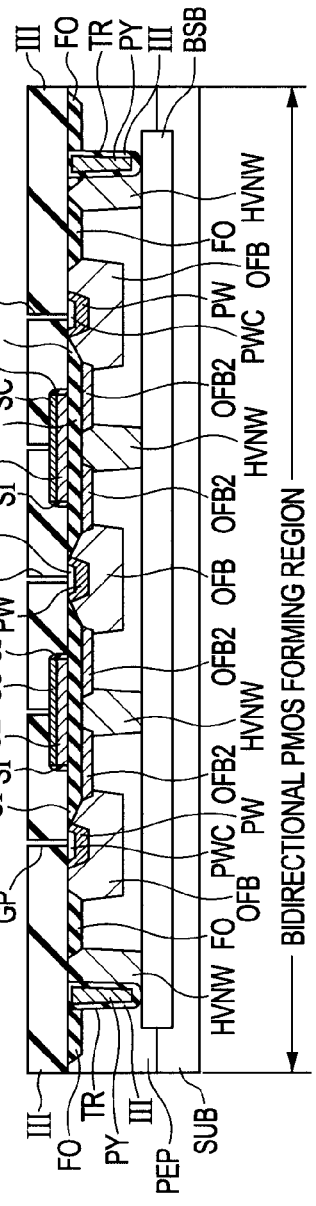
FIG. 29B is a schematic cross sectional view showing the 16th step of the manufacturing method in the HV-PMOS forming region for the bidirectional switch of the semiconductor device in the first embodiment of the invention.
Figure 29C:
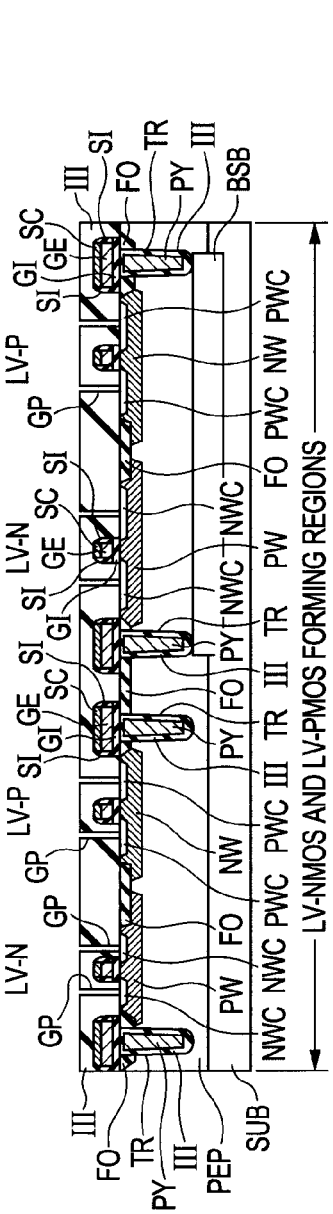
FIG. 29C is a schematic cross sectional view showing the 16th step of the manufacturing method in the LV-NMOS and LV-PMOS forming region of the semiconductor device in the first embodiment of the invention.

Referring to FIGS. 29A to 29C, an interlayer insulation layer III is formed so as to cover all of the respective constitutional elements (region) formed by the steps so far, for example, by a CVD method. Then, the interlayer insulation layer III just above the contact diffusion layers NWC and PWC is etched to form a gap GP by a usual photolithographic technique and an etching technique.

Referring to FIGS. 30A to 30C, for example, titanium (Ti) and titanium nitride (TiN) are formed by a sputtering method as a barrier metal for the inner wall and the bottom of the gap GP. Then, tungsten (W) is buried inside the gap GP for filling the inside of the GP, for example, by a CVD method. Then, thin films of titanium and titanium nitride, and tungsten on the upper surface of the insulation layer III formed by the step in FIG. 29 are removed by etching back. With the procedures described above, a contact layer CT (refer to FIG. 5) is formed.

Further, after forming a thin film, for example, of aluminum by a sputtering method, aluminum interconnects AL1 are formed at predetermined positions by patterning by a usual photolithographic technique and an etching technique, and a source electrode line S, a gate electrode line G, a drain electrode D, etc. are formed. With the procedures described above, the high voltage MOS transistor for the bidirectional switch shown in FIG. 5 is formed in FIG. 30B, and high voltage (low voltage) MOS transistors are formed also in other regions.

Second Embodiment

This embodiment is different in view of the conduction type of the epitaxial layer when compared with the first embodiment. This embodiment is to be described with reference to FIG. 31.

Figure 31:
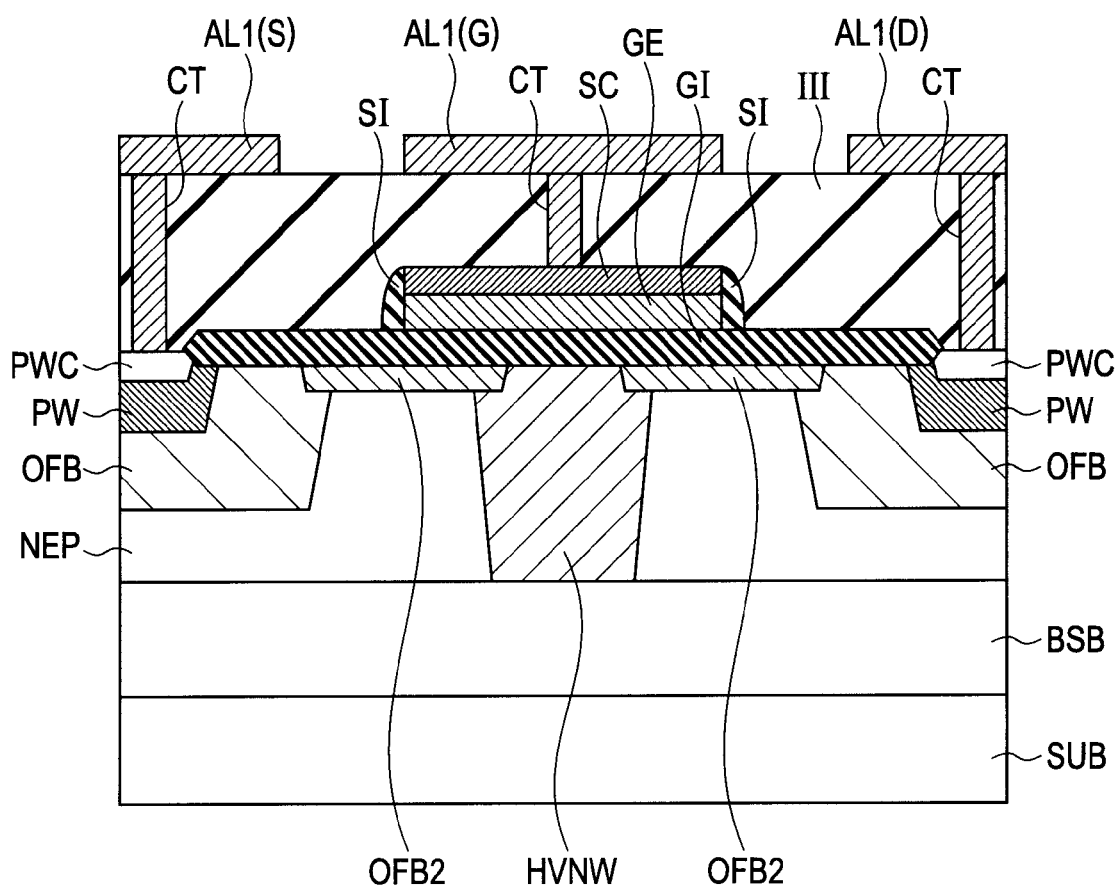
FIG. 31 is a schematic cross sectional view showing the configuration of a high voltage MOS transistor for a bidirectional switch according to a second embodiment of the invention.

When compared with the high voltage MOS transistor for the bidirectional switch according to the first embodiment shown in FIG. 5 a high voltage MOS transistor for a bidirectional switch in FIG. 31 is different only in that the conduction type of the epitaxial layer NEP is n-type. That is, in this embodiment, both of the epitaxial layer NEP and the well region HVNW contain the n-type impurity and the conduction type is identical between the epitaxial layer NEP (first conduction type) and the well region HVNW (second impurity layer) (both of them contain the n-type impurity).

The configuration of the high voltage MOS transistor in this embodiment shown in FIG. 31 is different in view of the above when compared with the configuration of the first embodiment shown in FIG. 5, and identical with the configuration of the first embodiment shown in FIG. 5 with respect to other points. Accordingly, identical elements carry the same reference numerals, for which duplicate description is to be omitted.

As in this embodiment, when the conduction type is identical between the epitaxial layer NEP and the well region HVNW, even if the concentration of the n-type impurity is lowered in the deep region of the well region HVNW (lower side in the drawing), the n-type impurity contained in the epitaxial layer NEP surrounding the well region HVNW can compensate the n-type impurity to the well region HVNW. Accordingly, in this embodiment, the concentration of the n-type impurity can be higher in the well region HVNW than that in the high voltage MOS transistor in the first embodiment. As a result, occurrence of current due to the punch through phenomenon can be suppressed between the diffusion layer OFB2 (p-type) and the well region HVNW (n-type) in the OFF state to enhance the effect of suppressing the lowering of the withstanding voltage further than in the first embodiment.

The manufacturing method of this embodiment is different from the manufacturing method of the first embodiment in that an epitaxial layer NEP (first impurity layer) containing the n-type impurity is formed in the step shown in FIG. 16 for the first embodiment. However, the manufacturing method is identical in other steps with the manufacturing method of the first embodiment.

The second embodiment of the invention is different from the first embodiment of the invention only with respect to the points described above. That is, all of the configurations, conditions, procedures, effects, etc. not described above for the second embodiment of the invention are based on the first embodiment of the invention.

Third Embodiment

This embodiment is different from the first embodiment in view of the conduction type, etc. for each of the constitutional elements. This embodiment is to be described with reference to FIG. 32 to FIG. 34.

Figure 32:
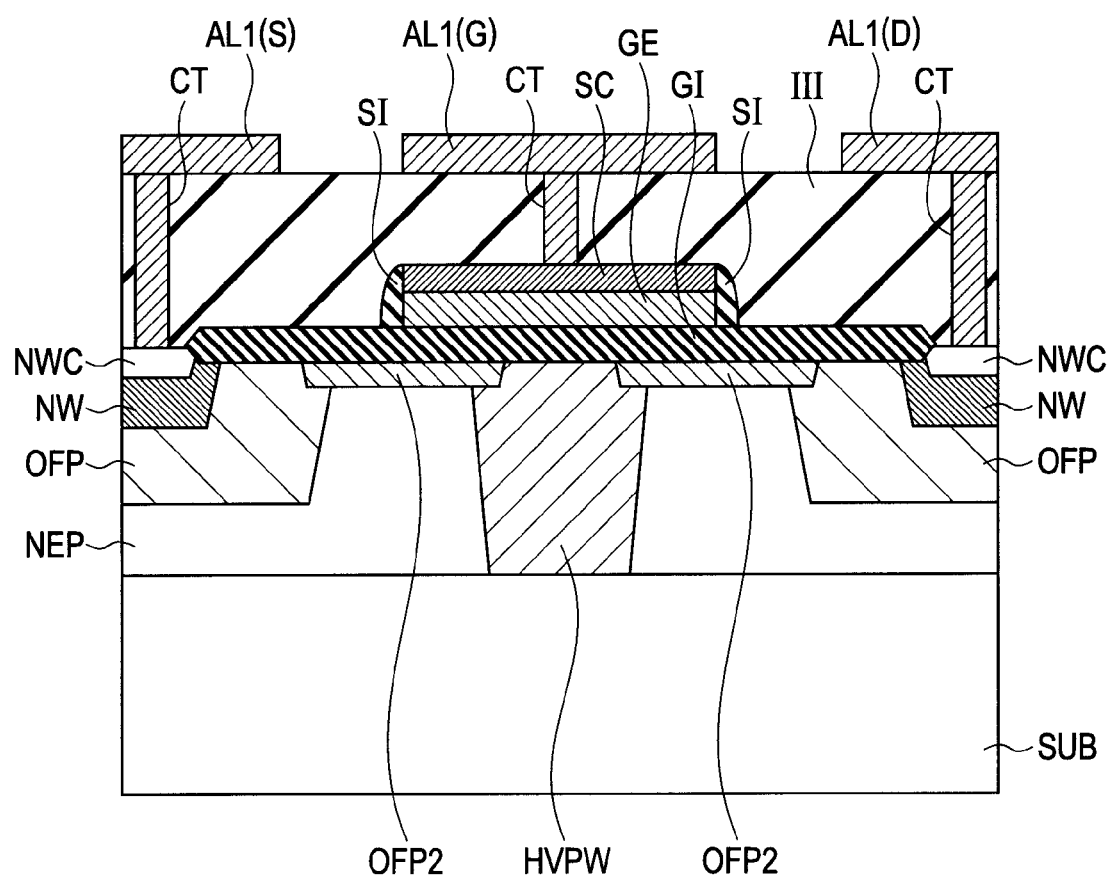
FIG. 32 is a schematic cross sectional view showing a first example for the configuration of a high voltage MOS transistor for a bidirectional switch according to a third embodiment of the invention.

A high voltage MOS transistor for a bidirectional switch in FIG. 32 is different from the high voltage MOS transistor for the bidirectional switch according to the first embodiment shown in FIG. 5 in view of the conduction type of the first impurity layer (epitaxial layer NEP), the second impurity layer (high voltage well region HVPW), the third impurity layer OFP, the fourth impurity layer (diffusion layer NW), the fifth impurity layer OFP2, and the contact diffusion layer NWC. That is, a high voltage well region HVNW has p-type impurity and the diffusion layers OFP and OFP2 have an n-type impurity. It is preferred that the n-type impurity is, for example, the impurity of phosphorus (P) in the same manner as in the first embodiment and the p-type impurity is, for example, the impurity of boron (B) in the same manner as in the first embodiment.

Further, in the transistor in FIG. 32, the buried diffusion layer BSB is not formed. The transistor of FIG. 32 is different from the transistor of FIG. 31 with respect to the points described above.

Figure 33:
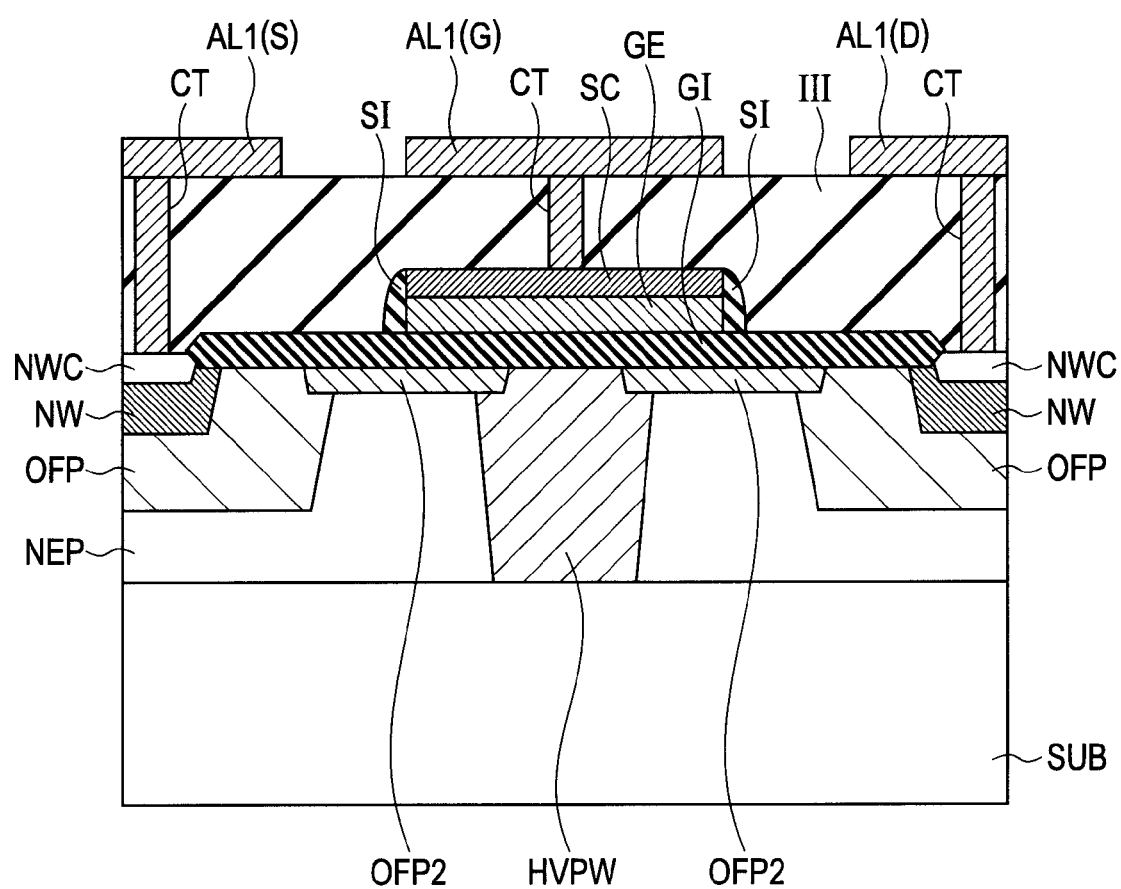
FIG. 33 is a schematic cross sectional view showing a second example for the configuration of a high voltage MOS transistor for a bidirectional switch according to the third embodiment of the invention.

The high voltage MOS transistor for the bidirectional switch in FIG. 33 is different from the high voltage MOS transistor in FIG. 32 only in that the epitaxial layer PFP is the p-type impurity layer. The high voltage MOS transistor for the bidirectional switch in FIG. 34 is different from the high voltage MOS transistor of FIG. 31 in that the buried diffusion layer BSB is not formed.

Figure 34:
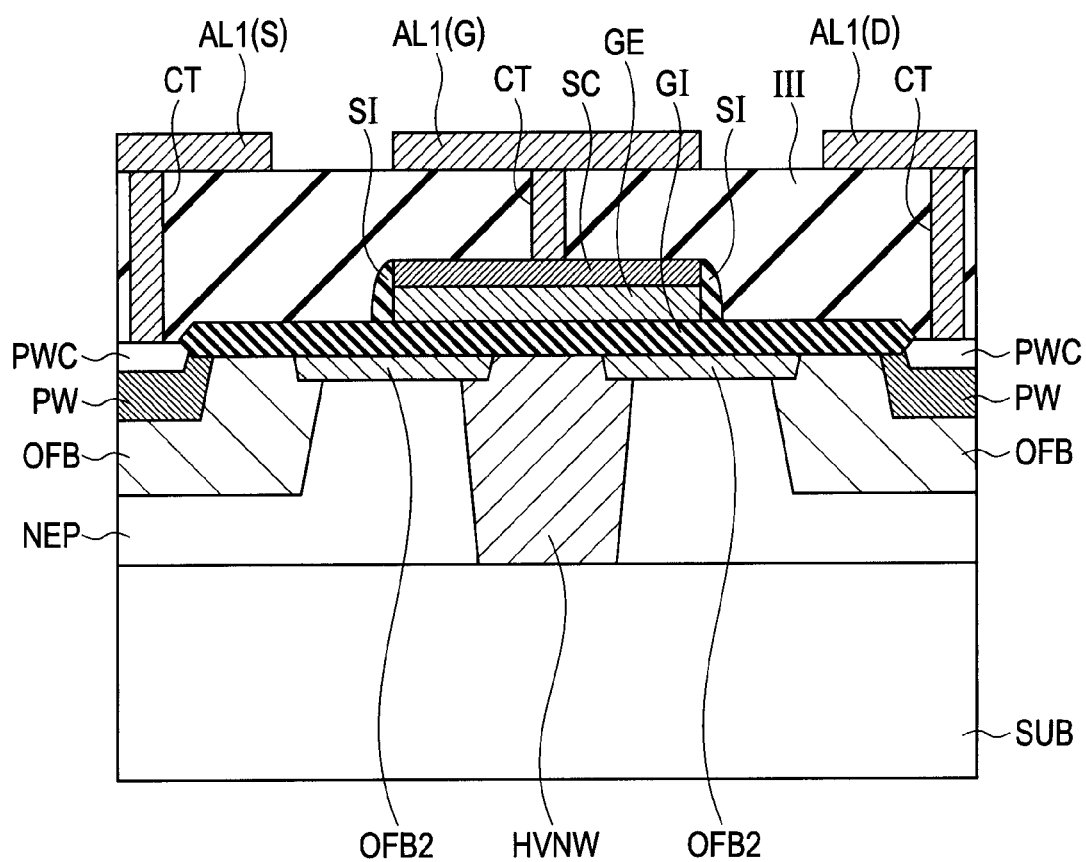
FIG. 34 is a schematic cross sectional view showing a third example for the configuration of a high voltage MOS transistor for the bidirectional switch according to the third embodiment of the invention.

The configuration of the high voltage MOS transistor shown in FIG. 32 to FIG. 34 is different from the configurations of other high voltage MOS transistors with the points described above and identical with the configuration of the first embodiment shown in FIG. 5 with respect to other points.

Accordingly, identical elements in FIG. 32 to FIG. 34 carry the same reference numerals for which duplicate description is to be omitted.

Even when the conduction type of the impurity is changed optionally in each of the constitutional elements as in each of the examples of this embodiment, the same function and the effect as in the first embodiment and the second embodiment can be obtained, providing that the position and the shape are identical with those of the first embodiment and the second embodiment, and the magnitude relation of the concentration of the impurity is identical with that of the first embodiment (for example, in FIG. 32, the concentration of the impurity is higher in the diffusion layer NW than in the diffusion layers OFP and OFP2, and the concentration of the impurity is higher in the diffusion layer OFP2 than that in the diffusion layer OFP.

In the manufacturing method of this embodiment, the conduction type of the formed impurity layer is different from that of the first embodiment in some steps for forming the manufacturing method of the first embodiment. For example, when the high voltage MOS transistor shown in FIG. 32 is formed, a high voltage well region HVNW containing the p-type impurity is formed instead of the high voltage well region HVNW in the step of FIG. 20B. Accordingly, n-type impurity, for example, boron (B) is implanted instead of the n-type impurity in a region where the high voltage well region HVPW is formed in the step in FIG. 17. In the same manner, the diffusion layer OFP containing the n-type impurity is formed instead of the diffusion layer OFB in the step of FIG. 20B. Accordingly, an n-type impurity, for example, phosphorus (P) is implanted instead of the p-type impurity in the region where the diffusion layer OFB is formed in the step shown in FIG. 19. Also in other regions, the region where the conduction type is different from that of the high voltage MOS transistor of the first embodiment (diffusion layer), is formed preferably by implantation of an impurity of different conduction type.

Since the high voltage MOS transistor shown in FIG. 32 is a so-called n-channel type transistor, in the manufacturing method of the transistor shown in FIG. 32, "bidirectional PMOS forming region" shown in FIGS. 15B to 30B in the first embodiment is "bidirectional NMOS forming region". Further, also the high voltage MOS transistor shown in FIG. 33 is a so-called n-channel type transistor, "bidirectional PMOS forming region" shown in FIG. 15B to FIG. 30B of the first embodiment is "bidirectional NMOS forming region".

Also in this embodiment, it is preferred that the impurity in the diffusion layers OFB, PW, and OFB2 is an impurity of the first conduction type and the impurity in the high voltage well region HVNW is an impurity of the second conduction type different from the first conduction type.

The third embodiment of the invention is different from the first embodiment of the invention only with respect to the points described above. That is, all of the configurations, conditions, procedures, effects, etc. not described above for the third embodiment of the invention are based on the first embodiment of the invention.

Fourth Embodiment

This embodiment is different from the first embodiment in view of the configuration of the diffusion layer OFB2. This embodiment is to be described with reference to FIG. 35 to FIG. 37.

Figure 35:
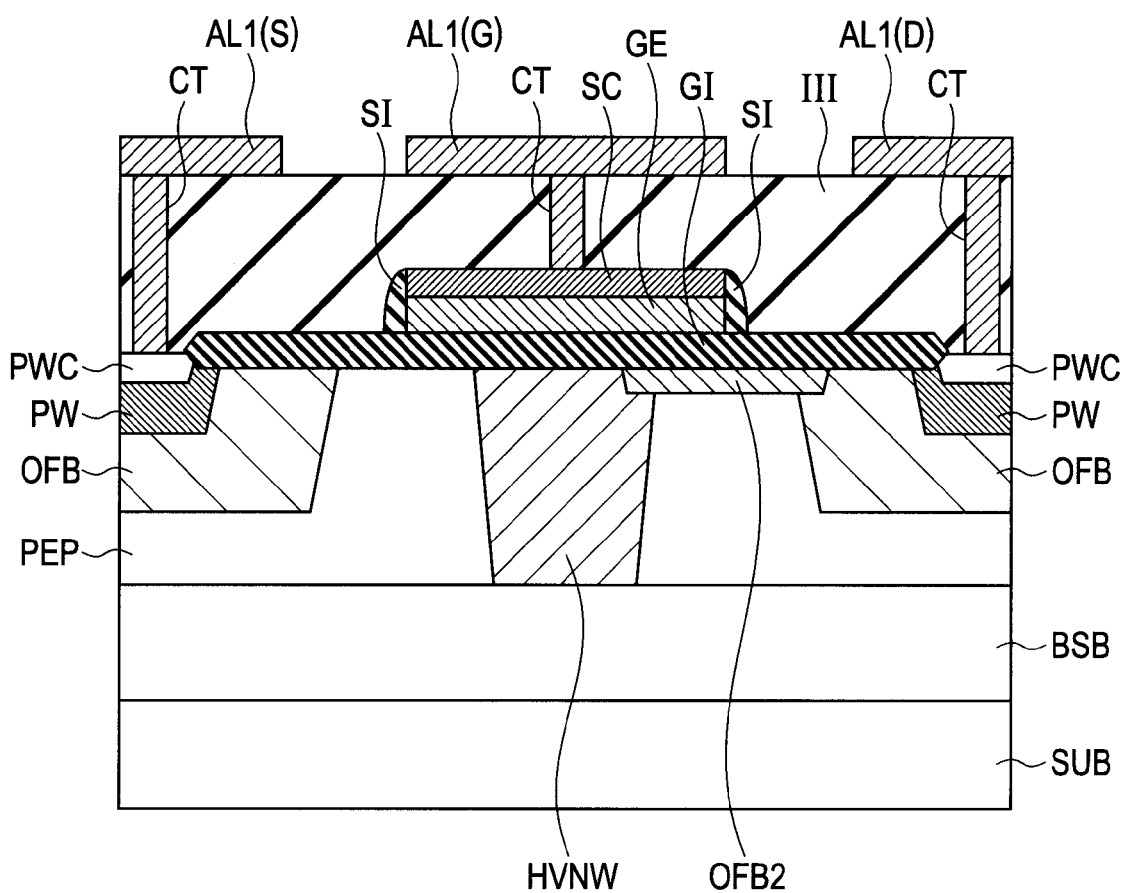
FIG. 35 is a schematic cross sectional view showing a first example for the configuration of a high voltage MOS transistor for a bidirectional switch according to a fourth embodiment of the invention.

A high voltage MOS transistor for a bidirectional switch in FIG. 35 is different from the high voltage MOS transistor for the bidirectional switch according to the first embodiment shown in FIG. 5 in that the diffusion layer OFB2 on one side is not present. Specifically, the diffusion layer OFB2 extending so as to protrude from the diffusion layer OFB for the source electrode line S in the direction where the well region HVNW is disposed is not formed. However, the diffusion layer OFB2 extending so as to protrude from the diffusion layer OFB of the drain electrode line D in the direction where the well region HVNW is disposed is formed so as to be coupled with the well region HVNW in the same manner as in the first embodiment. As a result, the high voltage MOS transistor in FIG. 35 is not disposed such that the position and the shape are symmetrical with respect to the high voltage well region HVNW in the entire single high voltage MOS transistor.

Figure 36:
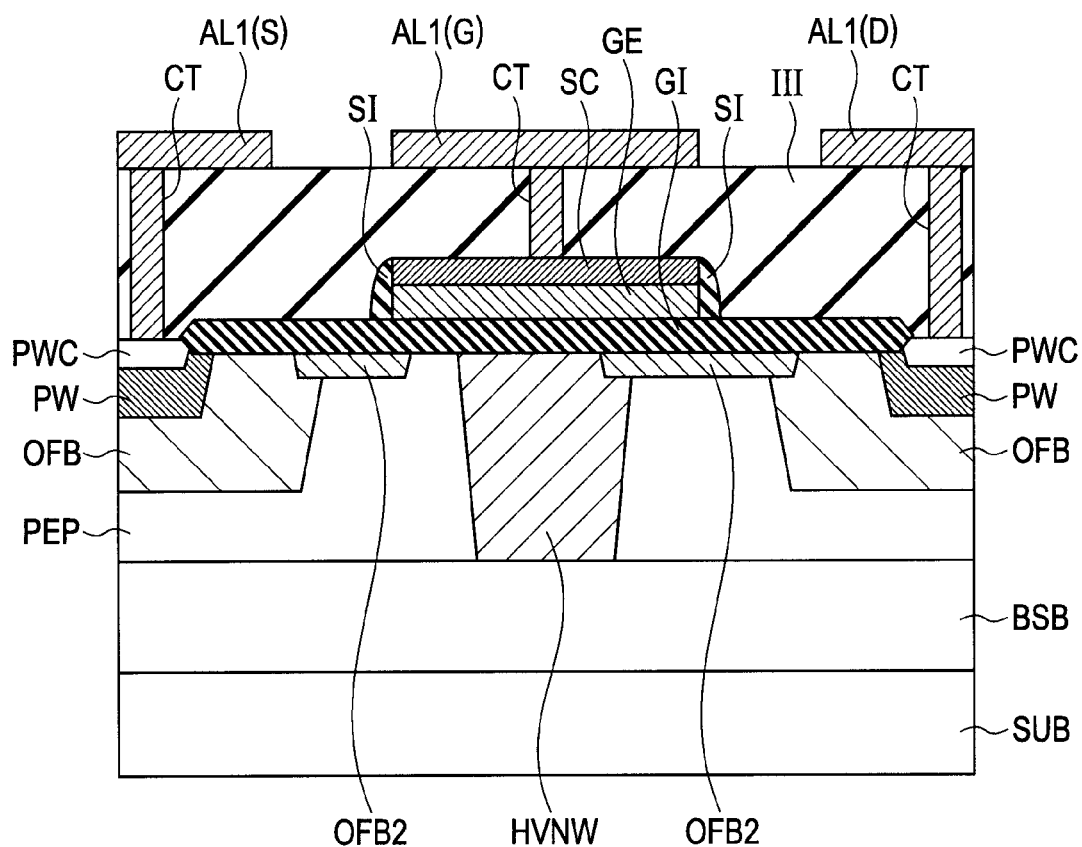
FIG. 36 is a schematic cross sectional view showing a second example for the configuration of the high voltage MOS transistor for the bidirectional switch according to the fourth embodiment of the invention.

In a high voltage MOS transistor for a bidirectional switch in FIG. 36, the length in which one diffusion layer OFB2 extends along the uppermost surface of the epitaxial layer PEP is shorter than that of the other diffusion layer OFB2 compared with the high voltage transistor for the bilateral switch according to the first embodiment shown in FIG. 5. Specifically, the diffusion layer OFB2 extending so as to protrude from the diffusion layer OFB for the source drain electrode S in the direction where the well region HVNW is disposed, has a shorter extending length in the right to left direction of the drawing than that of the diffusion layer OFB2 extending so as to protrude from the diffusion layer OFB for the drain electrode line D in the direction where the well region HVNW is disposed. That is, the diffusion layer OFB2 extending so as to protrude from the diffusion layer OFB for the source electrode line S in the direction where the well region HVNW is disposed is not coupled to the well region HVNW. As a result, the high voltage MOS transistor of FIG. 36 is not disposed such that the position and the shape are symmetrical with respect to the high voltage well region HVNW in the entire high voltage MOS transistor.

The configuration of the high voltage MOS transistor of this embodiment shown in FIG. 35 and FIG. 36 is different from the configuration of the first embodiment shown in FIG. 5 with respect to the points described above and is identical with the configuration of the first embodiment shown in FIG. 5. Accordingly, in FIG. 35 and FIG. 36 identical elements carry the same reference numerals for which duplicate description is to be omitted.

Figure 37:
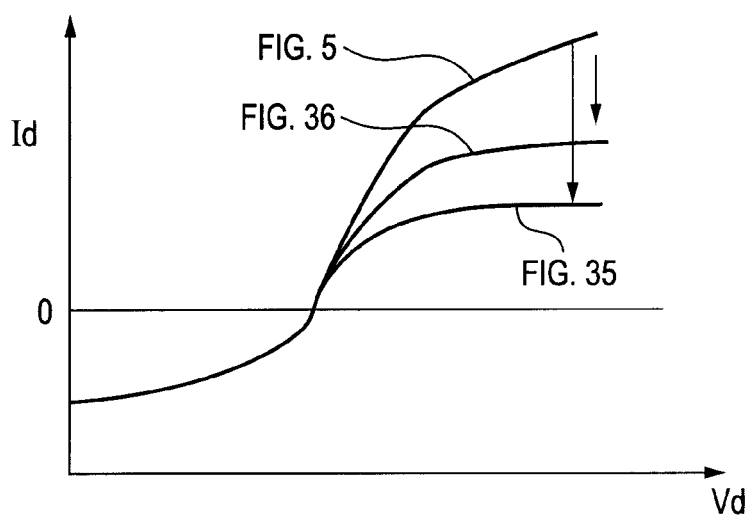
FIG. 37 is a graph for comparing a relation between the values for the drain voltage and the drain current between each of the high voltage MOS transistors shown in FIG. 5, FIG. 35, and FIG. 36.

The abscissa and the ordinate of the graph in FIG. 37 represent a drain voltage and a drain current applied to the high voltage MOS transistor for bidirectional switch respectively in the same manner as the graph of FIG. 7. Even when the diffusion layer OFB2 on one side is not present or shortened as in this embodiment, so long as the diffusion layer OFB2 on the other side has the same configuration as the transistor of the first embodiment shown in FIG. 5, this can provide the effect of substantially shortening the channel length in the ON state and suppressing increase in the ON-resistance. When both of the diffusion layers OFB2 are disposed so as to be coupled with the well region HVNW as in the transistor of the first embodiment shown in FIG. 5, since the channel length can be shortened substantially and the effect of suppressing increase in the ON-resistance can be enhanced further compared with the transistor of this embodiment shown in FIG. 35 and FIG. 36, the drain current is increased more. However, also in this embodiment, decrease in the withstanding voltage in the OFF state can be suppressed to ensure the function as the high voltage transistor in the same manner as in the first embodiment.

The high voltage MOS transistor according to this embodiment can enhance the effect of suppressing increase in the ON-resistance and lowering of the withstanding voltage in the OFF state when used as the transistor for the application use of flowing a current only in one direction, for example, from the drain to the source. That is, the high voltage MOS transistor of this embodiment may be used not being restricted only to the bidirectional switch.

The manufacturing method of this embodiment is different from the manufacturing method of the first embodiment in that the size of the diffusion layer OFB2 in the right to left direction in the drawing formed in the step shown in FIG. 26B of the first embodiment is different. Further, in the high voltage MOS transistor according to this embodiment, the diffusion layers OFB2 are not disposed so as to be symmetrical with respect to the high voltage well region HVNW. As described above, the high voltage MOS transistor of this embodiment is not restricted to the application use of the bidirectional switch. In this case, in the manufacturing method of the transistor shown in FIG. 35 and FIG. 36, "bidirectional PMOS forming region" shown in FIG. 15B to FIG. 30B of the first embodiment is, for example, "unidirectional PMOS forming".

The configuration shown in FIG. 35 and FIG. 36 may be used in combination with the high voltage MOS transistor having various configurations, for example, shown in the second embodiment and the third embodiment.

The fourth embodiment of the invention is different from the first embodiment of the invention only with respect to the points described above. That is, all of the configurations, conditions, procedures, effects, etc. not described above for the fourth embodiment of the invention are based on the first embodiment of the invention.

While all of the high voltage MOS transistors according to the invention described above are formed on a semiconductor SUB having the p-type impurity, the high voltage MOS transistor according to the invention may also be applied over a semiconductor substrate SUB having the n-type impurity.

It should be construed that the embodiments disclosed herein are only illustrative but not restrictive in all of the configurations. The range of the present invention is to be shown not the explanation described above but by the scope of the claims and it is intended to include all modifications or changes shown within equivalent meanings and ranges equivalent with those of the claims.

The present invention is applicable particularly advantageously to semiconductor devices having high voltage MOS transistors.

What is claimed is:

1. A semiconductor device having high voltage transistors, in which the high voltage transistors each comprise:
   a semiconductor substrate having a main surface;
   a first impurity layer formed over the main surface of the semiconductor substrate;
   a second impurity layer formed inside the first impurity layer,
   a pair of third impurity layers formed inside the first impurity layer so as to put the second impurity layer therebetween;
   a fourth impurity layer formed in the inside of each of the pair of the third impurity layers;
   a fifth impurity layer formed from an uppermost surface of the first impurity layer to the inside of the first impurity layer so as to protrude along the main surface from at least one of the third impurity layers in the direction where the second impurity layer is disposed; and
   a conductive layer formed over the uppermost surface so as to at least partially overlap the second impurity layer and fifth impurity layer in a plan view, wherein the second impurity layer is in direct physical contact with the fifth impurity layer and the second impurity layer extends towards the main surface of the substrate lower than the third impurity layers, wherein entireties of the third impurity layers are spaced apart from the second impurity layer so that a portion of the first impurity layer and a portion of the fifth impurity layer are between the second impurity layer and the third impurity layer, wherein a portion of the third impurity layer is directly between the fifth impurity layer and the fourth impurity layer, wherein the concentration of the impurity in the fourth impurity layer is higher than the concentration of the impurity in the third and the fifth impurity layers, wherein the impurity in the third and fifth impurity layers is a first conduction type impurity, and wherein the concentration of the first conduction type impurity in the fifth impurity layer is higher than the concentration of the first conduction type impurity in the third impurity layer.

2. The semiconductor device according to claim 1, wherein at least one of the third impurity layers and the second impurity layer are coupled by the fifth layer.

3. The semiconductor device according to claim 2, wherein the fifth impurity layer is formed so as to couple both of the pair of third impurity layers and the second impurity layer.

4. The semiconductor device according to claim 1, wherein the pair of third and fourth impurity layers are disposed such that the position and the shape are symmetrical with respect to the second impurity layer.

5. The semiconductor device according to claim 1, wherein the concentration of the impurity in the fifth impurity layer is higher than the concentration of the impurity in the second impurity layer.

6. The semiconductor device according to claim 1, wherein the impurity in the fourth impurity layer is a first conduction type impurity and the impurity in the second impurity layer is a second conduction type impurity.

7. The semiconductor device according to claim 1, wherein the impurity in the first impurity layer and the impurity in the second impurity layer are impurity of an identical conduction type.

8. A method of manufacturing a semiconductor device having high voltage transistors, the method comprising:
providing a semiconductor substrate having a main surface;
forming a first impurity layer over the main surface of the semiconductor substrate;
forming a second impurity layer inside the first impurity layer;
forming a pair of third impurity layers inside the first impurity layer so as to put the second impurity layer therebetween;
forming a fourth impurity layer to the inside of each of the pair of third impurity layers;
forming a fifth impurity layer from an uppermost surface of the first impurity layer to the inside of the first impurity layer so as to protrude along the main surface from at least one of the third impurity layers in the direction where the second impurity layer is disposed; and
forming a conductive layer above the an uppermost surface so as to overlap at least a portion of the second impurity layer and fifth impurity layer in a plan view,
wherein the second impurity layer is in direct physical contact with the fifth impurity layer and the second impurity layer extends towards the main surface of the substrate lower than the third impurity layers,
wherein entireties of the third impurity layers are spaced apart from the second impurity layer so that a portion of the first impurity layer and a portion of the fifth impurity layer are between the second impurity layer and the third impurity layer,
wherein a portion of the third impurity layer is directly between the fifth impurity layer and the fourth impurity layer,
wherein the concentration of the impurity in the fourth impurity layer is higher than the concentration of the impurity in the third and fifth impurity layers,
wherein the impurity in the third and fifth impurity layers is a first conduction type impurity, and
wherein the concentration of the first conduction type impurity in the fifth impurity layer is higher than the concentration of the first conduction type impurity in the third impurity layer.

9. A semiconductor device having high voltage transistors, in which the high voltage transistors each comprise:
a semiconductor substrate having a main surface;
a first impurity layer formed over the main surface of the semiconductor substrate;
a second impurity layer formed inside the first impurity layer,
a pair of third impurity layers formed inside the first impurity layer so as to put the second impurity layer therebetween;
a fourth impurity layer formed in the inside of each of the pair of the third impurity layers so that each third impurity layer surrounds one of the fourth impurity layers;
a fifth impurity layer formed from an uppermost surface of the first impurity layer to the inside of the first impurity layer so as to protrude along the main surface from at least one of the third impurity layers in the direction where the second impurity layer is disposed;
a sixth impurity layer formed in the inside of each of the fourth impurity layers so that each fourth impurity layer surrounds one of the sixth impurity layers; and
a conductive layer formed over the uppermost surface so as to at least partially overlap the second impurity layer and fifth impurity layer in a plan view,
wherein the second impurity layer extends towards the main surface of the substrate lower than the third impurity layers,
wherein entireties of the third impurity layers are spaced apart from the second impurity layer so that a portion of the first impurity layer and a portion of the fifth impurity layer are between the second impurity layer and the third impurity layer,
wherein a portion of the third impurity layer is directly between the fifth impurity layer and the fourth impurity layer,
wherein the concentration of the impurity in the fourth impurity layer is higher than the concentration of the impurity in the third and the fifth impurity layers,
wherein the concentration of the impurity in the fifth impurity layer is higher than the concentration of the impurity in the third impurity layer,
wherein the concentration of the impurity in the sixth impurity layer is higher than the concentration of the impurity in fourth impurity layer,
wherein the impurity in the sixth impurity layer is a first conduction type impurity, and
the sixth impurity layer is spaced apart from any second conduction type impurity layer.

10. The semiconductor device according to claim 9,
wherein the impurity in the third and fifth impurity layers is a first conduction type impurity, and
wherein the concentration of the first conduction type impurity in the fifth impurity layer is higher than the concentration of the first conduction type impurity in the third impurity layer.

11. The semiconductor device according to claim 10,
wherein the concentration of the first conduction type impurity in the sixth layer is higher than the concentration of the first conduction type impurity in the fifth impurity layer.

12. A semiconductor device having high voltage transistors, in which the high voltage transistors each comprise:
a semiconductor substrate having a main surface;
a first impurity layer formed over the main surface of the semiconductor substrate;
a second impurity layer formed inside the first impurity layer,
a pair of third impurity layers formed inside the first impurity layer so as to put the second impurity layer therebetween;
a fourth impurity layer formed in the inside of each of the pair of the third impurity layers;
a fifth impurity layer formed from an uppermost surface of the first impurity layer to the inside of the first impurity layer so as to protrude along the main surface from at least one of the third impurity layers in the direction where the second impurity layer is disposed;
a buried diffusion layer formed between the first impurity layer and the main surface of the semiconductor substrate; and
a conductive layer formed over the uppermost surface so as to at least partially overlap the second impurity layer and fifth impurity layer in a plan view,
wherein the second impurity layer extends from the uppermost surface to the buried diffusion layer and directly contacts the buried diffusion layer,
and the second impurity layer extends towards the main surface of the substrate lower than the third impurity layers,
wherein entireties of the third impurity layers are spaced apart from the second impurity layer so that a portion of the first impurity layer and a portion of the fifth impurity layer are between the second impurity layer and the third impurity layer,
wherein a portion of the third impurity layer is directly between the fifth impurity layer and the fourth impurity layer,
wherein the concentration of the impurity in the fourth impurity layer is higher than the concentration of the impurity in the third and the fifth impurity layers, and
wherein the concentration of the impurity in the fifth impurity layer is higher than the concentration of the impurity in the third impurity layer.

13. A semiconductor device having high voltage transistors, in which the high voltage transistors each comprise:
a semiconductor substrate having a main surface;
a first impurity layer formed over the main surface of the semiconductor substrate;
a second impurity layer formed inside the first impurity layer,
a pair of third impurity layers formed inside the first impurity layer so as to put the second impurity layer therebetween;
a fourth impurity layer formed in the inside of each of the pair of the third impurity layers;
a fifth impurity layer formed from an uppermost surface of the first impurity layer to the inside of the first impurity layer so as to protrude along the main surface from at least one of the third impurity layers in the direction where the second impurity layer is disposed; and
a conductive layer formed over the uppermost surface so as to at least partially overlap the second impurity layer and fifth impurity layer in a plan view,
wherein the second impurity layer extends towards the main surface of the substrate lower than the third impurity layers,
wherein entireties of the third impurity layers are spaced apart from the second impurity layer so that a portion of the first impurity layer and a portion of the fifth impurity layer are between the second impurity layer and the third impurity layer,
wherein a portion of the third impurity layer is directly between the fifth impurity layer and the fourth impurity layer,
wherein the concentration of the impurity in the fourth impurity layer is higher than the concentration of the impurity in the third and the fifth impurity layers, and
wherein the concentration of the impurity in the fifth impurity layer is higher than the concentration of the impurity in the third impurity layer.

14. A method of manufacturing a semiconductor device having high voltage transistors, the method comprising:
providing a semiconductor substrate having a main surface;
forming a first impurity layer over the main surface of the semiconductor substrate;
forming a second impurity layer inside the first impurity layer;
forming a pair of third impurity layers inside the first impurity layer so as to put the second impurity layer therebetween;
forming a fourth impurity layer to the inside of each of the pair of third impurity layers so that each third impurity layer surrounds one of the fourth impurity layers;
forming a fifth impurity layer from an uppermost surface of the first impurity layer to the inside of the first impurity layer so as to protrude along the main surface from at least one of the third impurity layers in the direction where the second impurity layer is disposed;
forming a sixth impurity layer in the inside of each of the fourth impurity layers so that each fourth impurity layer surrounds one of the sixth impurity layers; and
forming a conductive layer above the uppermost surface so as to overlap at least a portion of the second impurity layer and fifth impurity layer in a plan view,
wherein the second impurity layer extends towards the main surface of the substrate lower than the third impurity layers,
wherein entireties of the third impurity layers are spaced apart from the second impurity layer so that a portion of the first impurity layer and a portion of the fifth impurity layer are between the second impurity layer and the third impurity layer,
wherein a portion of the third impurity layer is directly between the fifth impurity layer and the fourth impurity layer,
wherein the concentration of the impurity in the fourth impurity layer is higher than the concentration of the impurity in the third and fifth impurity layers,
wherein the concentration of the impurity in the fifth impurity layer is higher than the concentration of the impurity in the third impurity layer, wherein the concentration of the impurity in the sixth impurity layer is higher than the concentration of the impurity in fourth impurity layer, wherein the impurity in the sixth impurity layer is a first conduction type impurity, and the sixth impurity layer is spaced apart from any second conduction type impurity layer.

15. The method according to claim 14, wherein the impurity in fifth impurity layer is a first conduction type impurity, and wherein the concentration of the first conduction type impurity in the sixth layer is higher than the concentration of the first conduction type impurity in the fifth impurity layer.

16. A method of manufacturing a semiconductor device having high voltage transistors, the method comprising:

providing a semiconductor substrate having a main surface;

forming a first impurity layer over the main surface of the semiconductor substrate;

forming a second impurity layer inside the first impurity layer;

forming a pair of third impurity layers inside the first impurity layer so as to put the second impurity layer therebetween;

forming a fourth impurity layer to the inside of each of the pair of third impurity layers;

forming a fifth impurity layer from an uppermost surface of the first impurity layer to the inside of the first impurity layer so as to protrude along the main surface from at least one of the third impurity layers in the direction where the second impurity layer is disposed;

forming a buried diffusion layer between the first impurity layer and the main surface of the semiconductor substrate; and forming a conductive layer above the uppermost surface so as to overlap at least a portion of the second impurity layer and fifth impurity layer in a plan view, wherein the second impurity layer extends from the uppermost surface to the buried diffusion layer and directly contacts the buried diffusion layer, and the second impurity layer extends towards the main surface of the substrate lower than the third impurity layers, wherein entireties of the third impurity layers are spaced apart from the second impurity layer so that a portion of the first impurity layer and a portion of the fifth impurity layer are between the second impurity layer and the third impurity layer, wherein a portion of the third impurity layer is directly between the fifth impurity layer and the fourth impurity layer, wherein the concentration of the impurity in the fourth impurity layer is higher than the concentration of the impurity in the third and fifth impurity layers, and wherein the concentration of the impurity in the fifth impurity layer is higher than the concentration of the impurity in the third impurity layer.

17. A method of manufacturing a semiconductor device having high voltage transistors, the method comprising:

providing a semiconductor substrate having a main surface;

forming a first impurity layer over the main surface of the semiconductor substrate;

forming a second impurity layer inside the first impurity layer;

forming a pair of third impurity layers inside the first impurity layer so as to put the second impurity layer therebetween;

forming a fourth impurity layer to the inside of each of the pair of third impurity layers;

forming a fifth impurity layer from an uppermost surface of the first impurity layer to the inside of the first impurity layer so as to protrude along the main surface from at least one of the third impurity layers in the direction where the second impurity layer is disposed; and forming a conductive layer above the uppermost surface so as to overlap at least a portion of the second impurity layer and fifth impurity layer in a plan view, wherein the second impurity layer extends towards the main surface of the substrate lower than the third impurity layers, wherein entireties of the third impurity layers are spaced apart from the second impurity layer so that a portion of the first impurity layer and a portion of the fifth impurity layer are between the second impurity layer and the third impurity layer, wherein a portion of the third impurity layer is directly between the fifth impurity layer and the fourth impurity layer, wherein the concentration of the impurity in the fourth impurity layer is higher than the concentration of the impurity in the third and fifth impurity layers, and wherein the concentration of the impurity in the fifth impurity layer is higher than the concentration of the impurity in the third impurity layer.

* * * * *